United States Patent
Naitoh et al.

(10) Patent No.: US 6,232,775 B1
(45) Date of Patent: May 15, 2001

(54) MAGNETO-IMPEDANCE ELEMENT, AND AZIMUTH SENSOR, AUTOCANCELER AND MAGNETIC HEAD USING THE SAME

(75) Inventors: Yutaka Naitoh; Teruo Bitoh; Takashi Hatanai; Akihiro Makino, all of Niigata-ken; Junichi Ouchi; Shinichi Sasaqawa, both of Miyagi-ken; Akihisa Inoue, 11-806 Kawauchijutaku, Kawauchi, 35 Motohasekura, Aoba-ku, Sendai-shi, Miyagi-ken; Tsuyoshi Masumoto, 3-8-22 Kamisugi, Aoba-ku, Sendai-shi, Miyagi-ken, all of (JP)

(73) Assignees: Alps Electric Co., LTD, Tokyo; Akihisa Inoue; Tsuyoshi Masumoto, both of Miyagi-Ken (JP)

( * ) Notice: Subject to any disclaimer, the term of this patent is extended or adjusted under 35 U.S.C. 154(b) by 0 days.

(21) Appl. No.: 09/211,126

(22) Filed: Dec. 14, 1998

(30) Foreign Application Priority Data

Dec. 26, 1997 (JP) ........................................ 9-361518
Jan. 5, 1998 (JP) ................................. 10-000498
Jan. 5, 1998 (JP) ................................. 10-000499
Jan. 5, 1998 (JP) ................................. 10-000500

(51) Int. Cl.[7] .......................... G01R 33/02; G11B 5/127; G11B 5/33; C22C 38/00; C22C 33/00
(52) U.S. Cl. ........................ 324/249; 324/225; 324/247; 148/305; 148/306; 148/310; 148/311; 315/8; 360/110
(58) Field of Search .................................. 324/225, 244, 324/247, 249, 252, 260; 360/110; 148/304–306, 310, 311; 315/8; 33/355 R, 356, 357, 363 R

(56) References Cited

U.S. PATENT DOCUMENTS

| 4,160,854 | * | 7/1979 | D'Silva . |
| 4,950,955 | * | 8/1990 | Hoover et al. ............................ 315/8 |
| 5,017,832 | * | 5/1991 | Takita ....................................... 315/8 |
| 5,031,063 | * | 7/1991 | Hasegawa . |
| 5,200,002 | * | 4/1993 | Hilzinger .............................. 148/304 |
| 5,764,055 | | 6/1998 | Kawase . |
| 5,831,432 | * | 11/1998 | Mohri ................................... 324/249 |
| 5,833,770 | * | 11/1998 | Ominato et al. ..................... 148/305 |
| 5,889,403 | * | 3/1999 | Kawase ................................ 324/249 |
| 5,894,388 | * | 4/1999 | Sato et al. . |
| 5,896,078 | * | 4/1999 | Hayakawa et al. ............. 148/306 X |

FOREIGN PATENT DOCUMENTS

| 2-215106 | * | 8/1990 | (JP) . |
| 8-263811A | | 10/1996 | (JP) . |
| 8-330645A | | 12/1996 | (JP) . |

* cited by examiner

Primary Examiner—Gerard R. Strecker
(74) Attorney, Agent, or Firm—Brinks Hofer Gilson & Lione

(57) ABSTRACT

A magneto-impedance element comprises an alloy composed of at least one of Fe, Co and Ni. The alloy has a mixed texture of an amorphous phase and a fine crystalline phase having an average crystal grain size of 50 nm or less. The magneto-impedance element shows a change in impedance in response to an external magnetic field by applying an alternating current. The magneto-impedance element is applied to an azimuth sensor, an autocanceler, or a magnetic head.

19 Claims, 18 Drawing Sheets

MAGNETO-IMPEDANCE ELEMENT, AND AZIMUTH SENSOR, AUTOCANCELER AND MAGNETIC HEAD USING THE SAME

BACKGROUND OF THE INVENTION

1. Field of the Invention

The present invention relates to a magneto-impedance element comprising an alloy which comprises at least one element selected from the group consisting of Fe, Co and Ni, and has a mixed texture of an amorphous phase and a crystalline phase. The present invention also relates to an azimuth sensor for detecting the direction of the geomagnetic flux, an autocanceler used in CRT displays, and a magnetic head using the magneto-impedance element.

2. Description of the Related Art

With rapid progress in development of information devices, gauging devices, and control devices, magneto-detective elements, which have a smaller size, higher sensitivity and more rapid response than conventional magnetic flux-detecting elements, have been required. Elements having a magneto-impedance effect, i.e., magneto-impedance elements (hereinafter referred to as MI elements) have attracted attention.

The magneto-impedance effect indicates a phenomenon causing a change in impedance in, for example, a closed circuit as shown in FIG. 17. When an alternating current Iac of a MHz band is applied to a wire or ribbon magnetic material Mi through an electrical power source Eac while a very weak external magnetic field Hex of several gausses is applied in the longitudinal direction of the magnetic material Mi, a voltage Emi by an impedance inherent in the magnetic material occurs between two ends of the magnetic material Mi, and its amplitude varies within a range of several tens of percent in response to the intensity of the external magnetic field Hex. Since the MI element is sensitive to an external magnetic field in the longitudinal direction of the element, the sensitivity for detecting a magnetic field does not deteriorate when the length of the sensor head is considerably short, i.e., 1 mm or less. The MI element enables fabrication of a very weak magnetic field sensor having a high resolution of $10^{-5}$ Oe or more and excitation at several MHz or more. Thus, a high-frequency magnetic field of 200 MHz to 300 MHz can be used as a carrier for frequency modulation, and thus the cutoff frequency of the magnetic field sensor can be easily set to 10 MHz or more. Accordingly, the MI element is expected to be used in novel ultra-compact magnetic heads and sensors for very weak magnetic fields.

Known materials having MI effects include, for example, amorphous ribbons of Fe—Si—B system alloys, e.g. $Fe_{78}Si_9B_{13}$, and amorphous wires of Fe—Co—Si—B system alloys, e.g., $(Fe_6Co_{94})_{72.5}Si_{12.5}B_{15}$ (Kaneo Mouri, et al., "Magneto-Impedance (MI) Elements", Papers of Technical Meeting on Magnetics, MAG-94 (1994), Vol. 1, No. 75–84, pp. 27–36, Institute of Electrical Engineering of Japan (IEE JAPAN)).

The Fe—Si—B system and Fe—Co—Si—B system alloys have problems when they are used as MI elements. As shown in FIG. 18, when an output voltage Emi (mV) to a positive or negative magnetic field is measured, the Fe—Si—B system alloy has low sensitivity for detecting the magnetic field as shown by a curve A, and thus a high amplification factor of about 100 times is required. The element, therefore, cannot be used as a magnetic field sensor with a high sensitivity because of noise generation. On the other hand, although the Fe—Co—Si—B system alloy shown by a curve B has a sufficiently high sensitivity, as shown in FIG. 18, it has a steep increase in the sensitivity within a range from −2 Oe to +2 Oe. As a result, it cannot be used as a sensing element for a very weak magnetic field due to non-quantitative characteristics within the range. Although it can be used in magnetic field regions of 2 Oe or more as the absolute value, a coil must be provided to apply a considerable amount of current that is required for such a large bias magnetic field.

Azimuth sensors can measure the direction of the magnetic flux of an external magnetic field such as geomagnetism, and have been widely used as sensors for vehicle compasses and navigation systems that detect the location of vehicles.

Among the azimuth sensors, since a flux gate sensor shows excellent stability according to its operational principle and a high sensitivity of $10^{-7}$ to $10^{-6}$ G, it has been widely used. The flux gate sensor includes a cyclic magnetic core, an exciting coil coiled around the magnetic core for applying a magnetic field, and a sensing coil for detecting the magnetic flux density of the magnetic core. Thus, it has a bulky shape and is miniaturized with great difficulty.

Another azimuth sensor uses two magnetoresistive or MR elements. These MR elements are arranged in a common plane so that paths of the currents applied to these MR elements are mutually perpendicular and connected to a bridge to detect the direction of the magnetic flux of an external magnetic field. The azimuth sensor has a simplified shape and will be easily miniaturized.

An azimuth sensor using conventional MR elements, however, has a small rate of change in inherent resistance of 3% to 6% to the intensity of the external magnetic field. Such an insensitive change is unsuitable for accurate measurement of a magnetic flux of an external magnetic field such as geomagnetism and thus to an azimuth sensor.

As a result of the trend towards high definition of CAD image information, the pitch of shadow mask holes in a display having a Braun or CRT tube (hereinafter referred to as a CRT display) has become finer. For example, a CRT display having a screen size of 14 inches has a pitch of 0.28 mm/mask. In such a high definition screen, electron beams in the CRT tube deviate from the objective lines by the effect of an external magnetic field such as geomagnetism, resulting in deterioration of image quality, e.g. distorted images, and uneven colors. Current CRT displays, therefore, have autocancelers for canceling the effect of the geomagnetism. The autocanceler has a canceling coil for applying a magnetic field having the reverse vector to the magnetic field of the geomagnetism, that is, a canceling magnetic field to the cathode ray tube, and a controller for controlling the vector of the canceling magnetic field.

A typical conventional controller for the autocanceler has a flux gate magnetic sensor having excellent stability according to its operational principle and a high sensitivity of $10^{-7}$ to $10^{-6}$ G, as in the azimuth sensor. The flux gate sensor includes a cyclic magnetic core, an exciting coil coiled around the magnetic core for applying a magnetic field, and a sensing coil for detecting the magnetic flux density of the magnetic core. Thus, it is bulky and is miniaturized with great difficulty.

Another magnetic sensor for the autocanceler uses two MR elements. These MR elements are arranged in a common plane so that paths of the currents applied to these MR elements are mutually perpendicular and connected to a bridge to detect the direction of the magnetic flux of an external magnetic field. The autocanceler has a simplified shape and will be easily miniaturized.

A magnetic sensor using conventional MR elements, however, has a small rate of change in inherent resistance of 3% to 6% to the intensity of the external magnetic field, as in the azimuth sensor. Such an insensitive change is unsuitable for accurate measurement of a magnetic flux of an external magnetic field such as geomagnetism. Thus, the vector of the canceling magnetic field for normally operating the autocanceler cannot be optimized.

Recently, further miniaturization and further improvement in recording density have been required in magnetic recording units, such as hard disk drives as external memory units, digital audio tape recorders, and digital videotape recorders. Development of high performance magnetic heads is essential for such requirements, and magnetic reproduction heads using MR elements have been developed.

Since a magnetic head having a MR element does not have a dependence on a relative velocity with respect to the recording medium, it is suitable for reading recorded signals at a low relative velocity. It has a low sensitivity to output signals because of a low change rate in response to a change in the recorded magnetization on the recording medium. Accordingly, it will be difficult to satisfy future demands for high-density recording.

Under the above-mentioned circumstances, MI elements have recently attracted attention. A typical conventional magnetic sensor of a magnetic head using the MI element will now be described with reference to the drawings. With reference to FIGS. 19A and 19B, a magnetic head 1 has a pair of cores 2a and 2b composed of ferrite as a ferromagnetic oxide, and a MI element 5 as a magnetic material. The MI element 5 is bonded to the cores 2a and 2b with a bonding glass 3 interposed therebetween. The MI element 5 is magnetically coupled with the cores 2a and 2b. That is, the ends 5a and 5b in the longitudinal direction of the MI element 5 are bonded to the magnetic circuit connecting faces 3a and 3b of the cores 2a and 2b, respectively. An insulating layer (not shown in the drawings) is formed on the magnetic circuit connecting faces 3a and 3b. The cores 2a and 2b and the MI element 5 thereby form a closed magnetic circuit.

The bonding glass 3 is composed of a nonmagnetic material, prevents direct magnetic coupling between the paired cores 2a and 2b, and is bonded to the lower faces of the cores 2a and 2b. A magnetic gap G is provided between the cores 2a and 2b. A regulating groove 4 is provided on the magnetic gap G for regulating the track width of the magnetic gap G, and filled with glass 8 as a nonmagnetic material. Conductive films composed of Cu, Au, or the like are deposited to form terminals 6a and 6b on the two ends of the MI element 5 in the longitudinal direction. The terminals 6a and 6b are each connected to a lead 7 for extracting output signals and a lead (not shown in the drawings) for applying an alternating current.

The magnetic head 1 operates as follows. An external magnetic field by the recorded magnetization on a recording medium (not shown in the drawing) invades the cores 2a and 2b through the magnetic gap G and is applied to the MI element 5. An alternating current of a MHz band has been previously applied to the MI element 5 to generate a voltage between two ends of the MI element 5 by the impedance inherent in the MI element. The amplitude of the voltage varies within a range of several tens of percent in response to the intensity of the external magnetic field and is extracted as output signals through the lead 7.

The magnetic head 1 using the MI element 5 has a significantly high change in the extracted voltage for a very weak external magnetic field of several gausses which is applied to the MI element 5 from the recording medium, hence the magnetic head 1 can have high sensitivity. Further, such high sensitivity permits reduction in the effective cross-sectional area of the magnetic flux in the magnetic circuit, and thus reduction in the size of the cores 2a and 2b, and this allows miniaturization of the magnetic head 1.

Conventional materials used for MI elements are amorphous ribbons composed of Fe—Si—B system alloys, e.g., $Fe_{78}Si_9B_{13}$ and amorphous wires composed of Fe—Co—Si—B system alloys, e.g., $(Fe_6Co_{94})_{72.5}Si_{12.5}B_{15}$, as described above. As shown in FIG. 18, however, a magnetic head using a MI element composed of the $Fe_{78}Si_9B_{13}$ alloy produce a low output voltage from the MI element for the applied external magnetic field. Thus, the output signals must be amplified by about 100 times. The element, therefore, cannot produce high quality output signals because of noise generation during the amplification.

On the other hand, a magnetic head 1 using a MI element composed of the $(Fe_6Co_{94})_{72.5}Si_{12.5}B_{15}$ alloy produces a high voltage from the MI element for the applied external magnetic field, resulting in a low amplification factor of the output signals, as shown in FIG. 18. The output voltage, however, steeply and nonquantitatively varies within the very weak external magnetic field range from −2 Oe to +2 Oe. As a result, the MR element cannot be used as a magnetic field detecting element of the magnetic head. Although it can be used in a magnetic field region of 2 Oe or more as the absolute value, a coil must be provided to apply a considerable amount of current that is required for such a large bias magnetic field. When the bias magnetic field is applied from a permanent magnet having a magnetization of about 2 Oe, a complicated configuration of the magnetic head 1 is unavoidable.

SUMMARY OF THE INVENTION

Accordingly, it is an object of the present invention to provide a magneto-impedance element having superior soft magnetism and suitable for detection of a magnetic field.

It is another object of the present invention to provide an azimuth sensor capable of miniaturization and exact measurement of the vector of the geomagnetic field.

It is still another object of the present invention to provide an autocanceler provided with an azimuth sensor capable of miniaturization and exact measurement of the vector of the geomagnetic field.

It is a further object of the present invention to provide a magnetic head outputting high-quality signals, having high sensitivity to a magnetic field from a magnetic recording medium, and having a simplified configuration.

A first aspect of the present invention is a magneto-impedance element comprising an alloy comprising at least one element selected from the group consisting of Fe, Co and Ni, and having a mixed texture of an amorphous phase and a fine crystalline phase having an average crystal grain size of 50 nm or less, the magneto-impedance element showing a change in impedance in response to an external magnetic field by applying an alternating current.

The alloy may further comprise B and at least one element selected from the group consisting of Ti, Zr, Hf, V, Nb, Ta, Cr, Mo and W.

The alloy may have a composition represented by the following formula (I):

$$(Fe_{1-a-b}Co_aNi_b)_cB_xM_y \quad (I)$$ 

wherein M is at least one element selected from the group consisting of Ti, Zr, Hf, V, Nb, Ta, Cr, Mo and W; and the subscripts a, b, c, x and y satisfy the relationships: $0 \leq a+b \leq 0.1$, 75 atomic percent $\leq c \leq 93$ atomic percent, 0.5 atomic percent $\leq x \leq 18$ atomic percent, and 4 atomic percent $\leq y \leq 9$ atomic percent.

The alloy may have a composition represented by the following formula (II):

$$(Fe_{1-a-b}Co_aNi_b)_cB_xM_yX_z \qquad (II)$$

wherein M is at least one element selected from the group consisting of Ti, Zr, Hf, V, Nb, Ta, Cr, Mo and W; X is at least one element selected from the group consisting of Si, Al, Ge, and Ga; and the subscripts a, b, c, x, y and z satisfy the relationships: $0 \leq a+b \leq 0.1$, 75 atomic percent $\leq c \leq 93$ atomic percent, 0.5 atomic percent $\leq x \leq 18$ atomic percent, 4 atomic percent $\leq y \leq 9$ atomic percent, and $z \leq 4$ atomic percent.

The alloy may have a composition represented by the following formula (III):

$$(Fe_{1-a-b}Co_aNi_b)_cB_xM_yT_d \qquad (III)$$

wherein M is at least one element selected from the group consisting of Ti, Zr, Hf, V, Nb, Ta, Cr, Mo and W; T is at least one element selected from the group consisting of Cu, Ag, Au, Pd, and Pt; and the subscripts a, b, c, x, y and d satisfy the relationships: $0 \leq a+b \leq 0.1$, 75 atomic percent $\leq c \leq 93$ atomic percent, 0.5 atomic percent $\leq x \leq 18$ atomic percent, 4 atomic percent $\leq y \leq 9$ atomic percent, and $d \leq 4.5$ atomic percent.

The alloy may have a composition represented by the following formula (IV):

$$(Fe_{1-a-b}Co_aNi_b)_cB_xM_yT_dX_z \qquad (IV)$$

wherein M is at least one element selected from the group consisting of Ti, Zr, Hf, V, Nb, Ta, Cr, Mo and W; T is at least one element selected from the group consisting of Cu, Ag, Au, Pd, and Pt; X is at least one element selected from the group consisting of Si, Al, Ge, and Ga; and the subscripts a, b, c, x, y, z and d satisfy the relationships: $0 \leq a+b \leq 0.1$, 75 atomic percent $\leq c \leq 93$ atomic percent, 0.5 atomic percent $\leq x \leq 18$ atomic percent, 4 atomic percent $\leq y \leq 9$ atomic percent, $d \leq 4.5$ atomic percent, and $z \leq 4$ atomic percent.

The alloy may further comprise at least one element selected from the group consisting of Ru, Rh, and Ir in an amount of 5 atomic percent or more in total.

A second aspect of the present invention is an azimuth sensor, for detecting the direction of the magnetic flux from an external magnetic field, comprising a magneto-impedance element comprising a soft magnetic alloy comprising at least one element selected from the group consisting of Fe, Co and Ni, and having a mixed texture of an amorphous phase and a fine crystalline phase having an average crystal grain size of 50 nm or less, the magneto-impedance element showing a change in impedance in response to an external magnetic field by applying an alternating current.

The soft magnetic alloy may further comprise B and at least one element selected from the group consisting of Ti, Zr, Hf, V, Nb, Ta, Cr, Mo and W.

The azimuth sensor may further comprises: a first magneto-impedance element as a sensing means of an X-axis component of the magnetic flux of the external magnetic field; and a second magneto-impedance element as a sensing means of a Y-axis component of the magnetic flux.

Preferably, the first and second magneto-impedance elements are arranged in the same plane so that the current paths of alternating currents applied to these elements are mutually perpendicular.

Preferably, a coil for applying a bias magnetization along the current path of the alternating current is wound around each of the first and second magneto-impedance elements.

Preferably, the soft magnetic alloy has a composition represented by any one of the above-mentioned formulae (I) to (IV).

A third aspect of the present invention is an autocanceler comprising: a magnetic sensor sensing a vector of the magnetic flux from an external magnetic field; a canceling coil for applying a canceling magnetic field having the reverse vector to said magnetic flux detected by the magnetic sensor to a CRT tube; and a control unit for controlling the vector of the canceling magnetic field based on the vector of the magnetic flux of the external magnetic field detected by the magnetic sensor; wherein the magnetic sensor comprises a magneto-impedance element comprising a soft magnetic alloy comprising at least one element selected from the group consisting of Fe, Co and Ni, and having a mixed texture of an amorphous phase and a fine crystalline phase having an average crystal grain size of 50 nm or less, the magneto-impedance element showing a change in impedance in response to an external magnetic field by applying an alternating current.

The soft magnetic alloy may further comprise B and at least one element selected from the group consisting of Ti, Zr, Hf, V, Nb, Ta, Cr, Mo and W.

The autocanceler may further comprises: a first magneto-impedance element as a sensing means of an X-axis component of the magnetic flux of the external magnetic field; and a second magneto-impedance element as a sensing means of a Y-axis component of the magnetic flux.

Preferably, the first and second magneto-impedance elements are arranged in the same plane so that the current paths of alternating currents applied to these elements are mutually perpendicular.

Preferably, a coil for applying a bias magnetization along the current path of the alternating current is wound around each of the first and second magneto-impedance elements.

Preferably, the soft magnetic alloy has a composition represented by any one of the above-mentioned formulae (I) to (IV).

A fourth aspect of the present invention is a magnetic head comprising a magneto-impedance element, the magneto-impedance element comprising a soft magnetic alloy comprising at least one element selected from the group consisting of Fe, Co and Ni, and having a mixed texture of an amorphous phase and a fine crystalline phase having an average crystal grain size of 50 nm or less, the magneto-impedance element showing a change in impedance in response to an external magnetic field by applying an alternating current.

The soft magnetic alloy may further comprise B and at least one element selected from the group consisting of Ti, Zr, Hf, V, Nb, Ta, Cr, Mo and W.

The magnetic head may further comprises a pair of cores and a bonding glass interposed between the pair of cores to bond one face of each of the pair of cores; wherein the magneto-impedance element is arranged over the pair of cores so that the external magnetic field is applied to the magneto-impedance element through the pair of cores.

Preferably, the pair of cores comprise ferrite.

A coil groove may be provided between an end and the other end of each of said pair of cores and a recording coil is wound around the coil groove.

The magneto-impedance element may further comprise a biasing means.

The biasing means may comprise a biasing coil wound around said coil groove. Alternatively, the biasing means may comprise a permanent magnet provided at the end of said magneto-impedance element.

Preferably, the soft magnetic alloy has a composition represented by any one of the above-mentioned formulae (I) to (IV).

DESCRIPTION OF THE PREFERRED EMBODIMENT

A magneto-impedance element (MI element) in accordance with the present invention comprises an alloy formed in a shape of a wire, a ribbon, or a thin film. The magneto-impedance element shows a change in impedance in response to an external magnetic field by applying an alternating current. The alloy comprises at least one element selected from the group consisting of Fe, Co and Ni, and having a mixed texture of an amorphous phase and a fine crystalline phase having an average crystal grain size of 50 nm or less. The alloy may further comprise boron (B) and at least one element selected from the group consisting of titanium (Ti), zirconium (Zr), hafnium (Hf), vanadium (V), niobium (Nb), tantalum (Ta), molybdenum (Mo) and tungsten (W).

Alternatively, the alloy may have a composition represented by any one of the following formulae:

  (I)

  (II)

  (III)

  (IV)

wherein M is at least one element selected from the group consisting of Ti, Zr, Hf, V, Nb, Ta, Cr, Mo and W; T is at least one element selected from the group consisting of Cu, Ag, Au, Pd, and Pt; X is at least one element selected from the group consisting of Si, Al, Ge, and Ga; and the subscripts a, b, c, x, y, z and d satisfy the relationships: $0 \leq a+b \leq 0.1$, 75 atomic percent $\leq c \leq 93$ atomic percent, 0.5 atomic percent $\leq x \leq 18$ atomic percent, 4 atomic percent $\leq y \leq 9$ atomic percent, $d \leq 4.5$ atomic percent, and $z \leq 4$ atomic percent.

In the production of the MI element in accordance with the present invention, a mixture of raw materials having the above-mentioned composition is melted by, for example, an arc melting process, and then quenched to form an amorphous alloy having a shape of a wire, a ribbon or a thin film. The amorphous alloy is annealed for crystallizing a part or most of the amorphous texture. The annealing temperature for crystallization depends on the composition of the alloy and is generally in a range of 400° C. to 700° C. After the annealing, the alloy has a mixed texture composed of an amorphous phase and fine crystalline grains.

Figure 17:
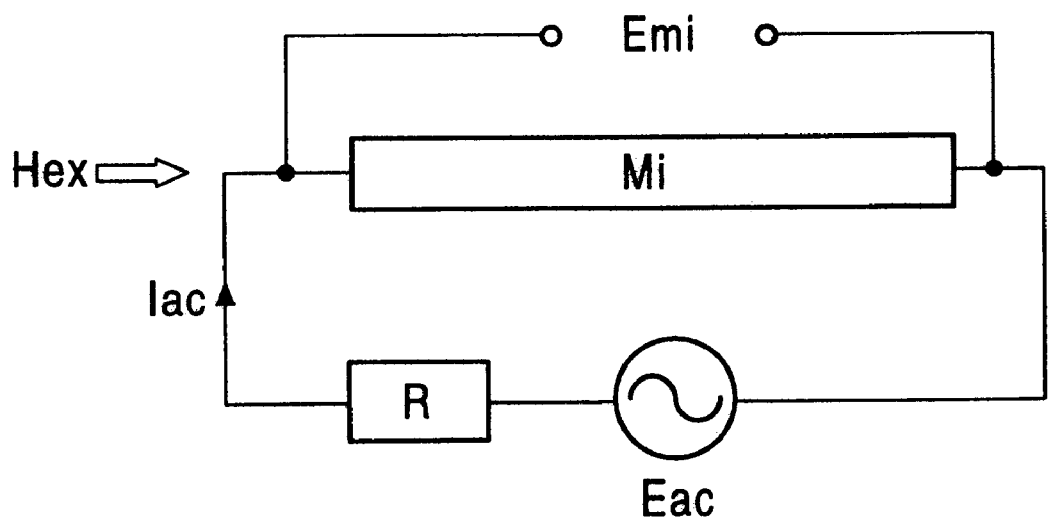
FIG. 17 is a general circuit diagram for determining a magnetic impedance.

A ribbon alloy produced as described above is inserted into a measuring circuit shown in FIG. 17 as a magnetic material Mi. An alternating current Iac of 3 MHz is applied to the magnetic material Mi while an external magnetic field Hex is applied in the longitudinal direction of the magnetic material Mi. The output voltage Emi or impedance linearly and symmetrically changes with an increasing magnetic field with respect to a magnetic field of zero, as shown in FIGS. 10 to 16. Thus, the MI element in accordance with the present invention has excellent linearity in impedance.

Figure 18:
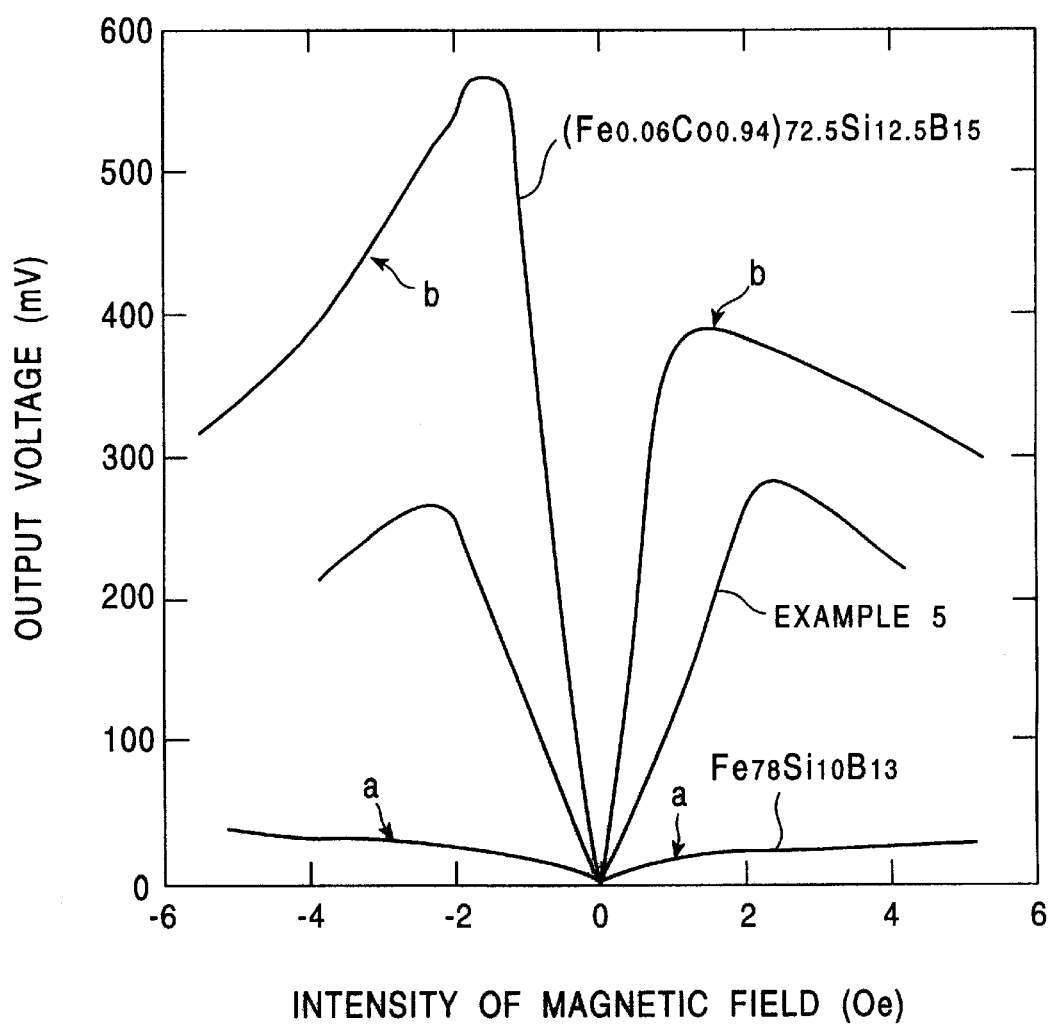
FIG. 18 is a graph showing sensitivity to a magnetic field of a MI element in Example 5 and conventional MI elements.
Figure 19A:
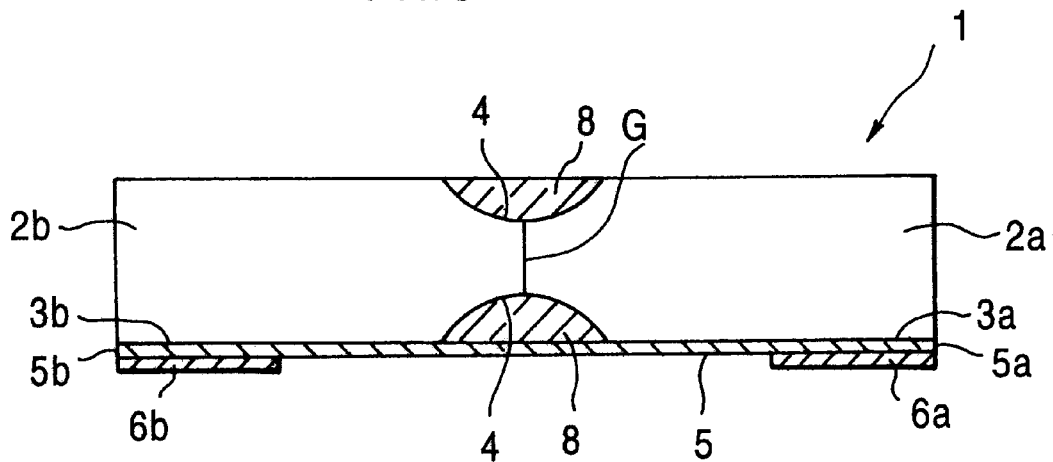
FIGS. 19A and 19B are a plan view and a front view, respectively, of a conventional magnetic head.
Figure 19B:
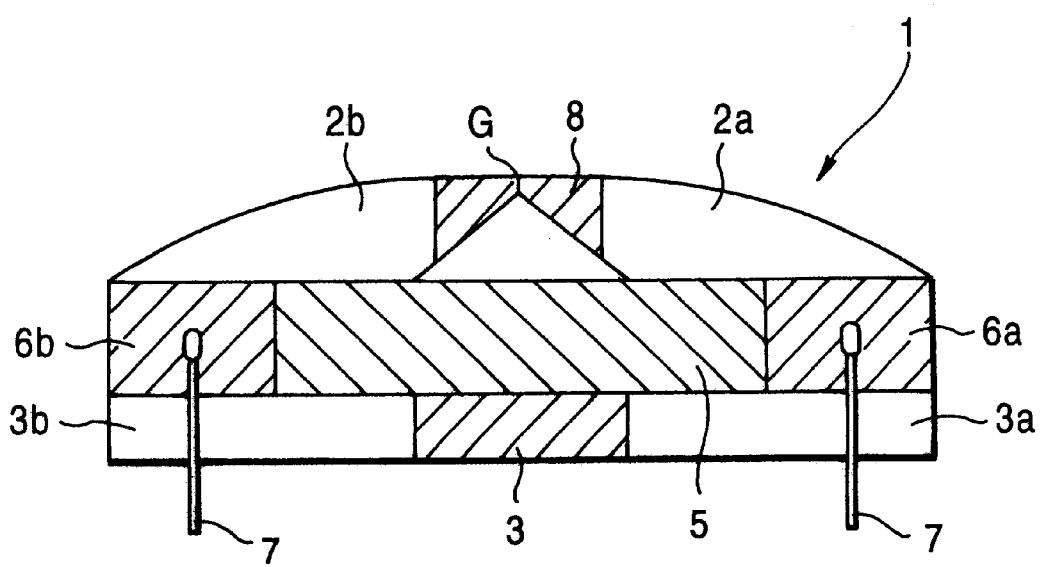

The MI element in accordance with the present invention has a higher sensitivity than the conventional MI element A represented by $Fe_{78}Si_{19}B_{13}$ in FIG. 18. Thus, the detection circuit for the magnetic field can operate with a low amplification factor and thus with reduced noise. The MI element in accordance with the present invention shows a moderate increase in the output voltage within a very weak magnetic field (−2 Oe to +2 Oe) compared with the conventional MI element B represented by $(Fe_6Co_{94})_{72.5}Si_{12.5}B_{15}$, in FIG. 18, resulting in high quantitative characteristics. Furthermore, such an increase in the output voltage shows high symmetry and linearity. Thus, the MI element in accordance with the present invention permits a simplified configuration of a detection circuit for magnetic fields. Accordingly, the MI element in accordance with the present invention can be preferably used as a magnetic field detection element.

Reasons for Composition Limitations

The reasons for the limitations of the compositions of the alloy used in the MI element in accordance with the present invention will now be described.

Fe, Co and/or Ni as the main components in the alloy have magnetic characteristics and are essential for achieving high magnetic flux density and superior soft magnetism. The total content of these magnetic metals (represented by the subscription c in the above-mentioned formulae) is 93 atomic percent or less. When c is greater than 93 atomic percent, a single amorphous phase is difficult to form by a liquid quenching process. As a result, the annealed alloy has an inhomogeneous texture not having high permeability. It is preferable that c be 75 atomic percent or more to achieve a high saturation magnetic flux density of 10 kG or more. Thus, it is preferable that c be in a range of 75 to 93 atomic percent. A portion of the Fe may be replaced with Co and/or Ni to adjust magnetostriction. The total content of Co and Ni is preferably 10% or less and more preferably 5% or less of Fe. The permeability will decrease when the total content is higher than the upper limit. Accordingly, the total content a+b of Co and Ni is in a range of, preferably $0 \leq a+b \leq 0.1$, and more preferably $0 \leq a+b \leq 0.05$.

B (boron) enhances formability of the amorphous phase in the soft magnetic alloy, prevents coarsening of the crystalline texture, and suppresses the formation of the compound phase adversely affecting the magnetic characteristics during the annealing step.

Zr, Hf and Nb are not substantially dissolved into $\alpha$-Fe; however, these can be excessively dissolved into an amorphous texture by quenching the alloy. Parts of these elements are crystallized as a fine crystalline phase during the subsequent annealing step, in order to improve soft magnetism of the soft magnetic alloy and to reduce the magnetostriction of the alloy ribbon. Allowing the amorphous phase in the grain boundary that inhibits the crystal grain growth to remain is essential for the precipitation of the fine crystalline phase and suppression of the coarsening of the fine crystalline phase.

The amorphous phase in the grain boundary seems to dissolve M elements, such as Zr, Hf and Nb, released from $\alpha$-Fe with an increase in temperature, and thus to suppress the formation of an Fe—M compound causing deterioration of the soft magnetism. The addition of B contributing to the formation of the amorphous phase is, therefore, essential for the Fe—Zr(Hf,Nb) alloy.

At a boron content x of less than 0.5 atomic percent, the amorphous phase in the grain boundary is not sufficiently stabilized. On the other hand at a boron content x of higher than 18 atomic percent, borides tend to form in the B—M system alloy and the Fe—B system alloy, and thus the annealing conditions for forming the fine crystalline texture are restricted. Such optimization of the boron content enables the formation of fine crystalline phase having an average grain size of 50 nm or less and preferably 30 nm or less.

The soft magnetic alloy in accordance with the present invention preferably contains at least one element selected from the group consisting of Zr, Hf and Nb. Parts of these components may be replaced with any one of Ti, V, Ta, Mo and W in the Group 4A to 6A elements having high formability of the amorphous phase. These M elements have relatively low diffusion rates, hence the addition of the M elements decreases the growing rate of the fine crystalline nuclei and enhances the formability of the amorphous phase, resulting in the formation of fine crystalline texture.

The growing rate of the crystalline nuclei does not decrease at an M-element content y of less than 4 atomic percent. Thus, the crystal grains are coarsened, and satisfactory soft magnetism is not achieved. For example, in an Fe—Hf—B alloy, an average crystal grain size is 13 nm for a Hf content of 5 atomic percent, whereas 39 nm for 3 atomic percent. On the other hand, an M—B or Fe—M compound tends to form at an M-element content y of higher than 9 atomic percent. Thus, satisfactory magnetic characteristics are not achieved. The quenched ribbon alloy is too brittle to form a core with a given shape. Thus, the content y is in a range of 4 to 9 atomic percent.

Among the M elements, Nb, Mo and W having large absolute values of the free energy of oxide formation are thermally stable and barely oxidized in the production process of the soft magnetic alloy. The soft magnetic alloy containing the M elements can, therefore, be readily produced with low production costs. For example, the soft magnetic alloy is produced in the atmosphere while partly supplying an inert gas to the nozzle edge of the crucible used for quenching the molten alloy.

It is preferable that at least one component X selected from the group consisting of Si, Al, Ge and Ga be added in a total amount of 4 atomic percent or less. These components are known as semi-metal elements and dissolved into a body-centered-cubic (bcc) phase that consists of essentially Fe. A content of higher than 4 atomic percent causes an increased magnetostriction, a decreased saturation magnetic flux density, or a decreased permeability.

These components contribute to an increase in electrical resistance and a decrease in iron loss of the soft magnetic alloy. These effects are prominent in aluminum (Al). Ge and Ga contribute to the reduction of fine crystal grain size. Thus, the addition of Al, Ge and Ga is effective. In particular, sole use of Al, Ge or Ga, or combined use of Al and Ge, Al and Ga, Ge and Ga, or Al, Ge and Ga is preferable.

At least one metal T selected from the group consisting of Cu, Ag, Au, Pd and Pt may be added in a total amount of 4.5 atomic percent or less in order to further improve the soft magnetism. These metals are not dissolved into Fe, and form clusters at an initial stage of the crystallization. As a result, Fe-enriched regions form in the texture. Many $\alpha$-Fe nuclei form from the Fe-enriched regions. According to differential thermal analysis, the addition of these metals causes a slight decrease in the crystallization temperature. The addition of these metals seems to cause the formation of an inhomogeneous amorphous phase, which is unstable. In the crystallization of the inhomogeneous amorphous phase, many crystalline nuclei inhomogeneously form and thus a fine crystal grain texture is achieved. Thus, any other element causing a decrease in the crystallization temperature will also contribute to the formation of a fine crystal grain texture.

At least one element selected from the group consisting of Ru, Rh, and Ir may be added in order to improve corrosion resistance of the alloy. Since a content of the element higher than 5 atomic percent causes a significant decrease in the saturation magnetic flux density, the content is controlled to be 5 atomic percent or less.

The soft magnetic alloy in accordance with the present invention may contain other elements, e.g., Y, La, Ce, Pr, Nd, Pm, Sm, Eu, Gd, Tb, Dy, Ho, Er, Tm, Yb, Lu, Zn, Cd, In, Sn, Pb, As, Sb, Bi, Se, Te, Li, Be, Mg, Ca, Sr, and B, for the purpose of controlling the magnetostriction of the alloy.

The soft magnetic alloy may also contain incidental impurities such as H, N, O and S, as long as these impurities do not contribute to deterioration of the desired magnetic characteristics.

The MI element comprising the soft magnetic alloy in accordance with the present invention has soft magnetism and is sensitive to a change in the magnetic field in the longitudinal direction of the MI element. When a coil of a magnetic sensing head is produced using the alloy, the coil is excited in the circumferential direction by a current, and thus a reversed magnetic field due to the magnetic field in the longitudinal direction of the head is significantly small. As a result, the length of the head can be significantly decrease compared with conventional magnetic flux detection-type magnetic sensors, such as flux gate sensors. Furthermore, the head has a wide range of change rate in impedance from several tens to 100%/Oe, a high resolution of $10^{-6}$ Oe, a cutoff frequency of several MHz, superior soft magnetism, such as permeability, and a high saturation magnetic flux density. Thus, a highly sensitive and significantly compact magnetic sensor head can be fabricated. For example, a magnetic head with an extremely reduced length of 1 mm or less has a high detection limit of $10^{-6}$ Oe for an AC magnetic field of 1 Hz or more. In other words, the surface magnetic field (approximately 0.1 Oe at a position 2 mm from the surface) of a ring magnet for a 1,000-pole rotary encoder with a diameter of 19 mm (the magnetization distance: approximately 60 $\mu$m) can be exactly detected at a position 1 mm or more from the ring magnet. The head can also readily detect geomagnetism of approximately 0.3 Oe.

The magnetic head using the MI element in accordance with the present invention has high-speed responsiveness, since it detects a change in the magnetic flux that quickly responds to the rotation of the magnetization. When a high-frequency current is applied to the coil, the impedance sensitively changes in response to the external magnetic field due to the skin effects, and the movement of the magnetic wall is suppressed by a strong overcurrent restriction. Thus, only the rotation of the magnetization vector generates a circumferential magnetic flux, resulting in high-speed responsiveness.

An amplitude-modulation-type sensor is formed of a self-oscillator such as a Colpitts oscillator using the MI element in accordance with the present invention. The sensor has a cutoff frequency, which is approximately one-tenth the oscillation frequency, and can detect a wide range of magnetic fields over a direct current to a high frequency of several MHz with a high sensitivity of approximately $10^{-6}$ Oe. The sensor has a high response speed, which is 1,000 times that of a conventional flux gate sensor having high sensitivity. The high-speed responsiveness of the magnetic head is essential for detecting the magnetic information on magnetic recording media. For example, when a 2,000-pole ring magnet with a diameter of 19 mm rotates at 3,600 rpm, a MHz-band cutoff frequency is required for detecting a fundamental wave of 120 kHz and harmonic waves thereof. The cutoff frequency in current videotape recorders is 4.75 MHz, but will be 50 MHz in the future. The magnetic head having the MI element in accordance with the present invention can respond to the future demand by applying an alternating current of 500 MHz or more.

The configuration of the very weak magnetic sensor using the thin film MI element in accordance with the present invention is determined such that the sensitivity is not disturbed by floating impedance of the circuit caused by the use of the high-frequency current. Accordingly, a preferred configuration is a self-oscillation magnetic sensing circuit in which the MI head and the high-frequency power source are integrated.

Figure 9:
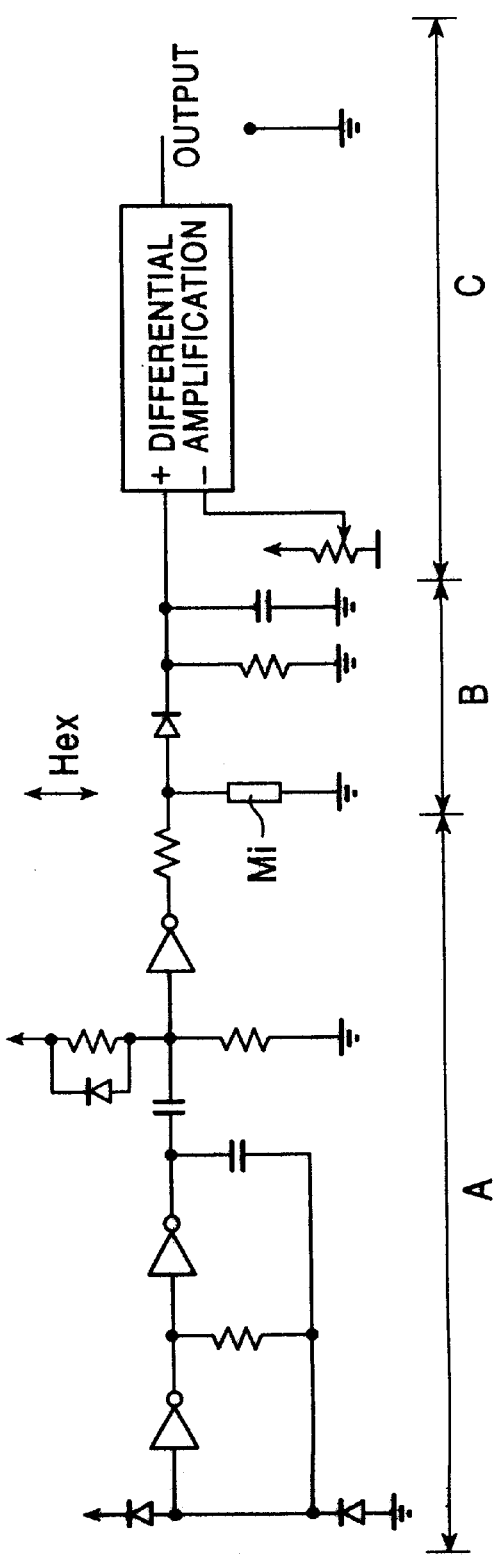
FIG. 9 is a circuit diagram of a sensing device using a MI element in accordance with the present invention.
Figure 10:
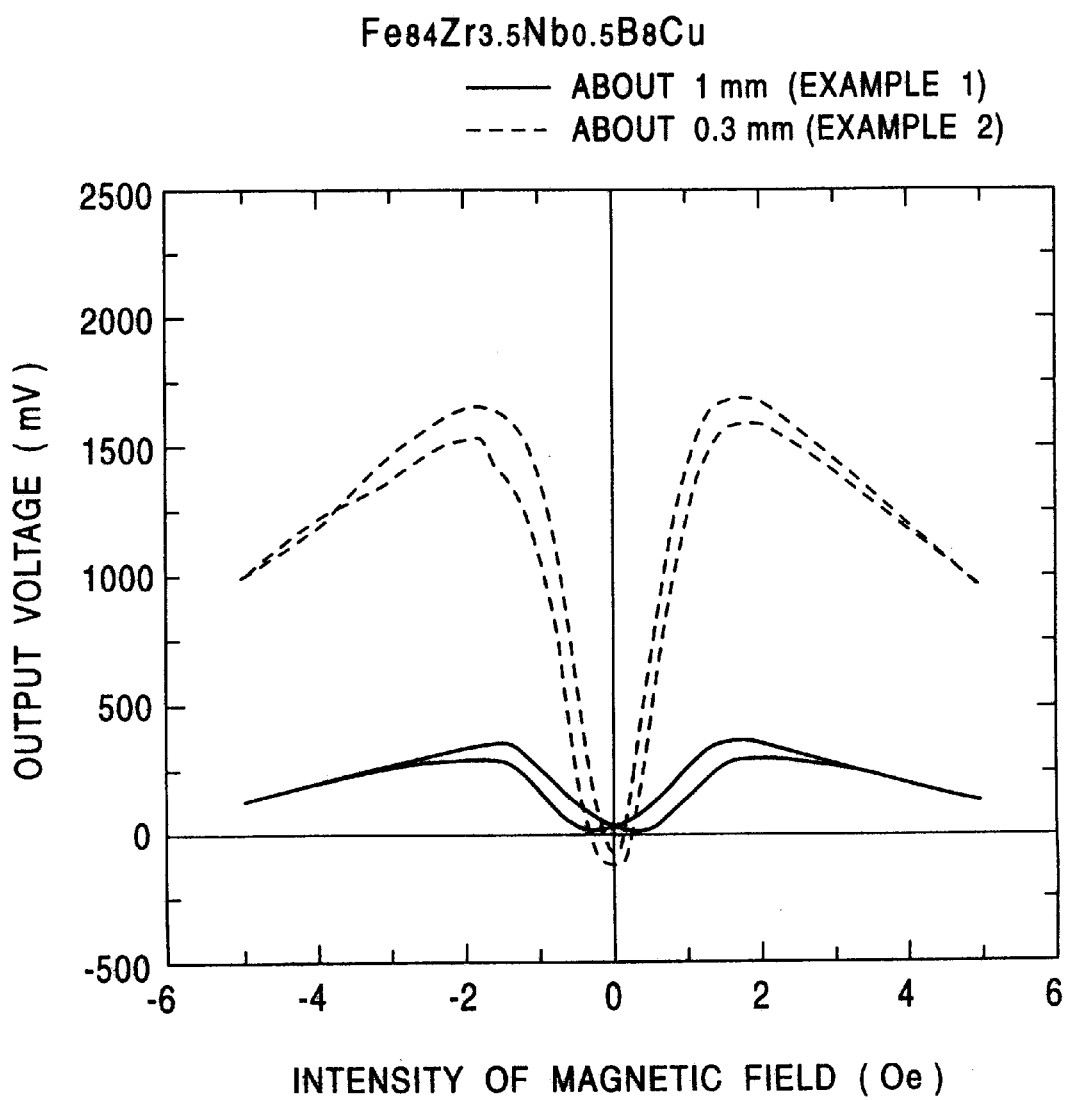
FIG. 10 is a graph showing sensitivity to a magnetic field of MI elements in Examples 1 and 2.
Figure 11:
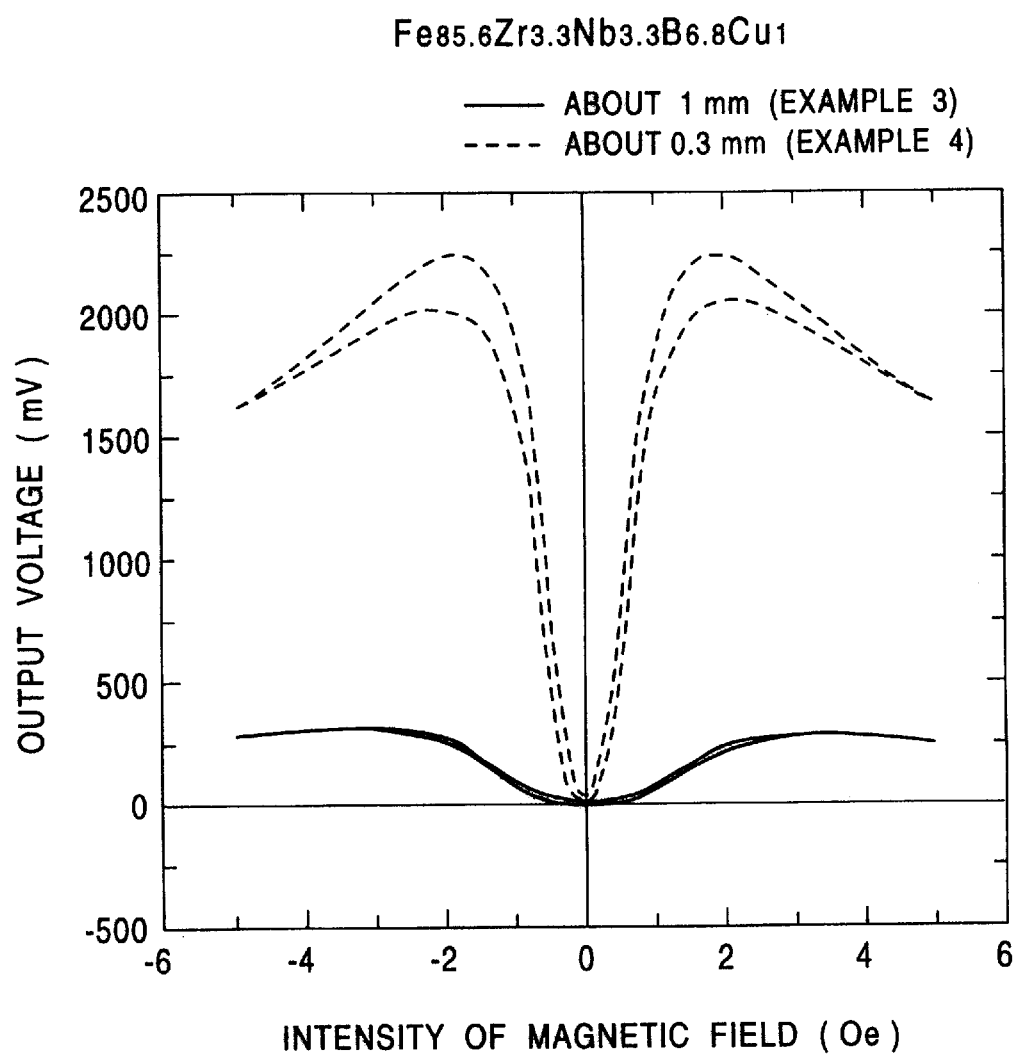
FIG. 11 is a graph showing sensitivity to a magnetic field of MI elements in Examples 3 and 4.
Figure 12:
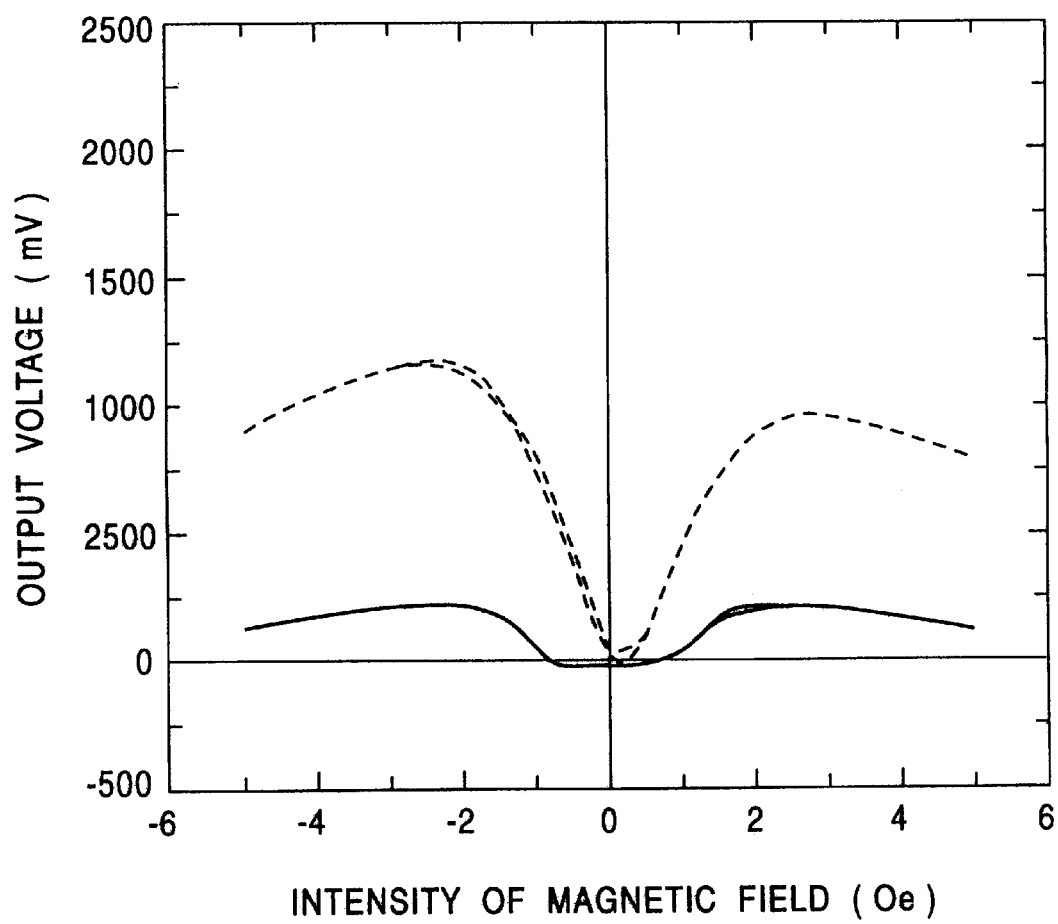
FIG. 12 is a graph showing sensitivity to a magnetic field of MI elements in Examples 5 and 6.
Figure 13:
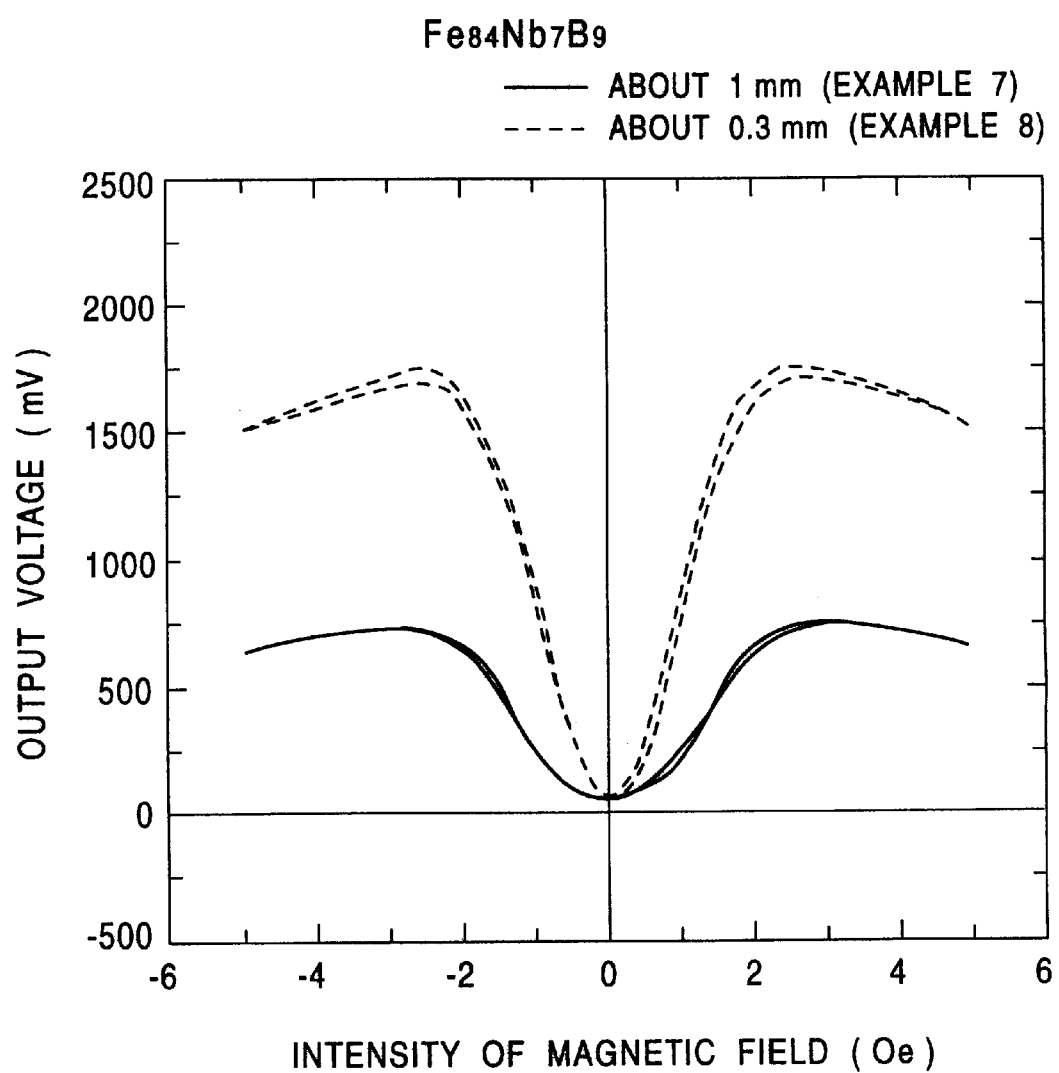
FIG. 13 is a graph showing sensitivity to a magnetic field of MI elements in Examples 7 and 8.
Figure 14:
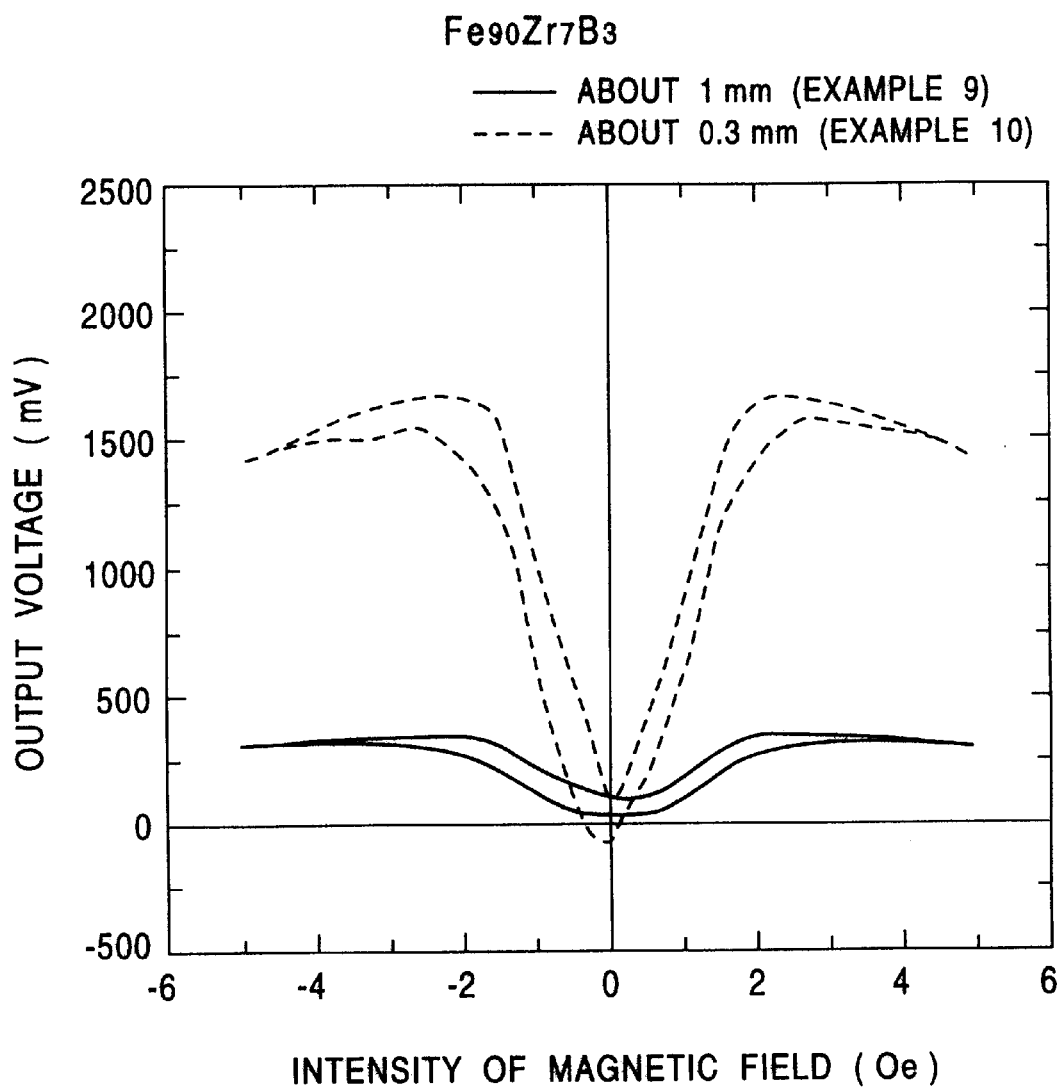
FIG. 14 is a graph showing sensitivity to a magnetic field of MI elements in Examples 9 and 10.
Figure 15:
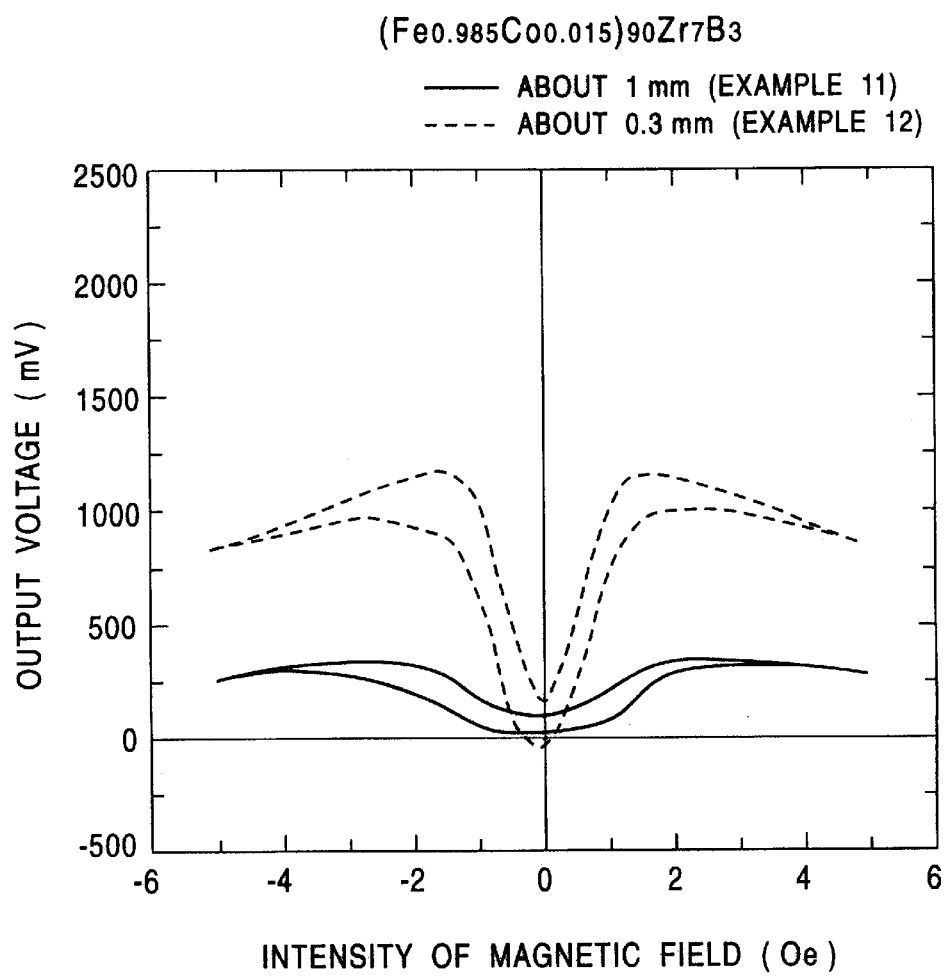
FIG. 15 is a graph showing sensitivity to a magnetic field of MI elements in Examples 11 and 12.
Figure 16:
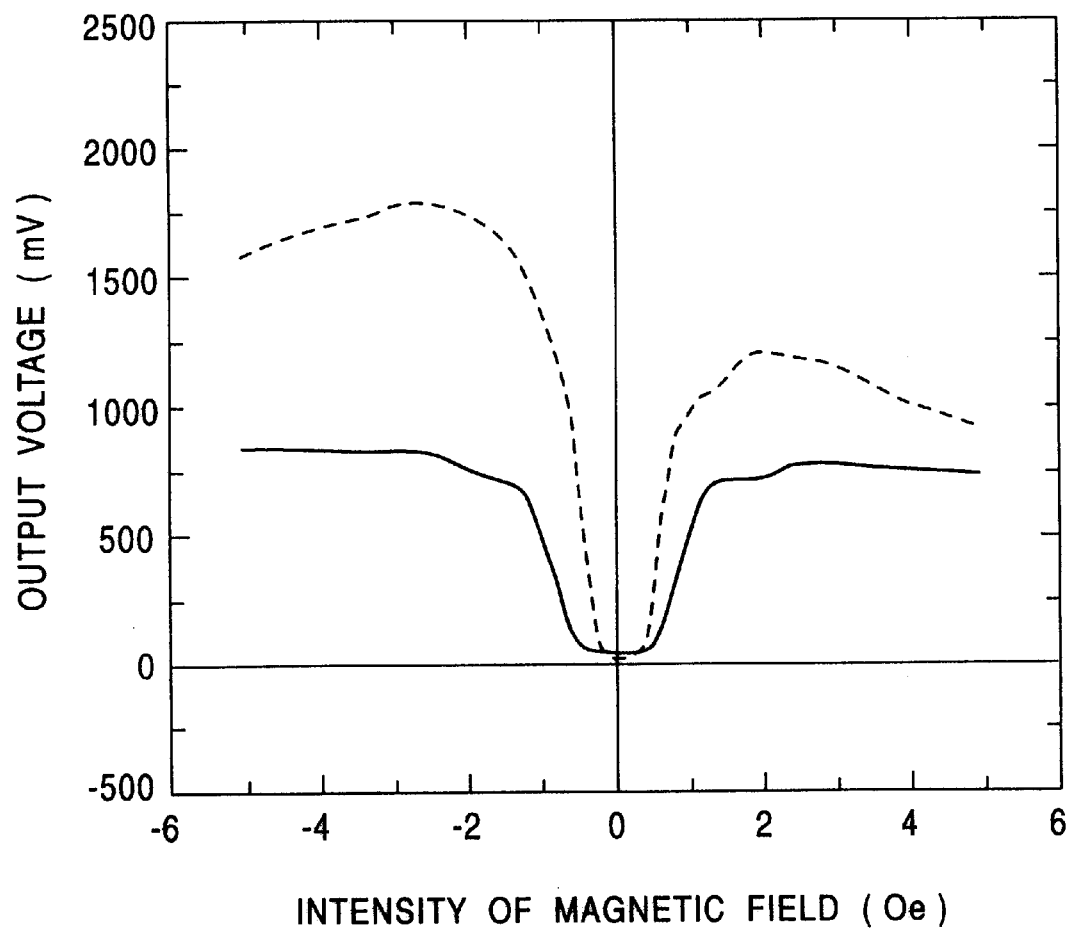
FIG. 16 is a graph showing sensitivity to a magnetic field of MI elements in Examples 13 and 14.

FIG. 9 shows a magnetic sensing circuit having the self-oscillation circuit. With reference to FIG. 9, the circuit include blocks A, B and C corresponding to a high-frequency electrical power source section, a detecting section of an external magnetic field (Hex), and an amplification section, respectively. A MI head Mi is mounted in the detecting section B.

The high-frequency electrical power source section A generates a high-frequency alternating current to supply to the detecting section B. The system of the power source section A is not limited. In this embodiment, a stabilized Colpitts oscillator is used. The self-oscillation system may be sensitive to the external magnetic field by magnetic modulation, such as amplitude modulation (AM), frequency modulation (FM) or a phase modulation (PM).

The detecting section B includes the MI element and a demodulation circuit. The MI element, which is in a waiting state by a high-frequency alternating current from the high-frequency power source section A, causes a change in impedance in response to the external magnetic field (Hex). A demodulation circuit demodulates such a change to transmit the demodulated signal to the amplification section C.

The amplification section C includes a differential amplification circuit and output terminals. An output voltage (mV) from the MI element is generated between the output terminals. The magnetic sensing circuit has a negative feedback loop circuit and functions as a very weak magnetic sensing circuit with high accuracy, high sensitivity, high-speed response and high stability by such a strong negative feedback.

The MI element in accordance with the present invention generally shows a symmetrical change in impedance with respect to an external magnetic field of zero. Thus, the magnetic head as a linear magnetic field sensor requires direct current magnetic biasing. Since the MI element in accordance with the present invention has a high linearity at a very weak magnetic field, it can respond with a very weak biasing magnetic field. Thus, a biasing current of several mA is desirably introduced into a biasing coil of 10 to 20 turns that is wound around the MI head.

A twisting stress may be applied to the MI element of the MI head to generate helical magnetic anisotropy. When the MI element is excited by an alternating current superimposed with a DC biasing current, an output by an asymmetric magnetic impedance effect is obtained with respect to an external magnetic field (Hex). A liner magnetic sensor is formed of two MI elements and detects a differential voltage between the voltages of these MI elements. This configuration is advantageous for a current sensor using a long head.

The MI element in accordance with the present invention, having superior characteristics, can be applied to very weak magnetic field sensors, current sensors with high-speed responsiveness, azimuth sensors for very weak magnetism, flux gate sensors, magnetic wave detectors, potentiometers, rotary encoder heads, electronic compasses, magnetic heads, tablets, magnetic defect search heads, magnetic cards, magnetic ticket heads, magnetic proximity switches, magnetic flash memories, magnetic neurons, antenna cores, magnetic fluid monitors for medical use, etc.

An azimuth sensor using the MI element in accordance with the present invention will now be described.

Figure 1:
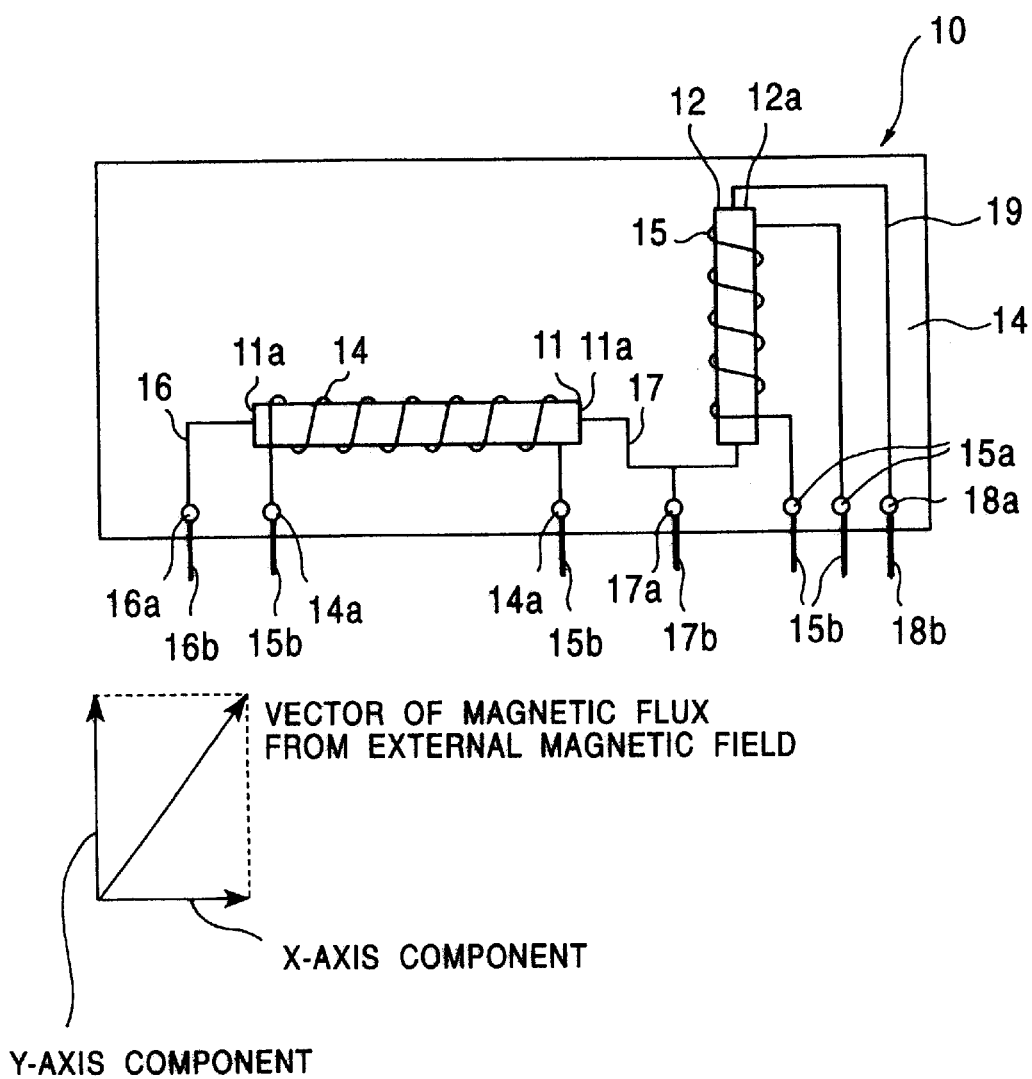
FIG. 1 is a plan view of an azimuth sensor in accordance with the present invention.

With reference to FIG. 1, an azimuth sensor 10 has a first MI element 11 as a detecting means for the component in the X axis of an external magnetic field, and a second MI element 12 as a detecting means for the component in the Y axis, perpendicular to the X axis, of the external magnetic field.

The first and second MI elements 11 and 12 are composed of a soft magnetic alloy having fine crystalline grains and containing at least one element selected from the group consisting of Fe, Co and Ni as a primary component; at least one element selected from the group consisting of Ti, Zr, Hf, V, Nb, Ta, Cr, Mo, and W; and boron (B). These elements have a planar rectangular shape with a predetermined thickness. The soft magnetic alloy shows a magneto-impedance effect, in which the impedance changes with an external magnetic field when an AC current is applied to the alloy.

The first and second MI elements 11 and 12 are arranged in a plane 13 such that the directions of the alternating current paths in these elements are mutually perpendicular. In other words, the longitudinal directions of the first and second MI elements 11 and 12 are mutually perpendicular. These elements may be affixed onto the plane 3 by any affixing means.

The first and second MI elements 11 and 12 are not limited to the plate as shown in FIG. 1, and may be a rod, a ribbon, a wire, a line or a plurality of twisted wires or lines.

Coils 14 and 15 are wound around the longitudinal directions of the first and second MI elements 11 and 12, respectively, in order to apply biasing magnetization along the alternating current paths applied to the first and second MI elements 11 and 12. Two ends of the coils 14 and 15 are connected to external leads 14b and 15b, respectively, with coil terminals 14a and 15b, respectively, provided therebetween. Both longitudinal ends 11a and 12b, respectively, of the first and second MI elements 11 and 12 are connected to output leads 16, 17 and 18, respectively, for extracting the output current. The output leads 16 and 18 are connected to external output leads 16b and 18b, respectively, with output terminals 16a and 18a, respectively, therebetween. Two ends of the output lead 17 are connected to the terminal 12a of the first MI element 11 and the terminal 12a of the second MI element 12. The output lead 17 is also connected to an external output lead 17b with an output terminal 17a provided therebetween. In addition, two ends 11a and 12a of the first and second MI elements 11 and 12, respectively, are connected to leads (not shown in the drawing) for applying an alternating current.

The operation of the azimuth sensor is as follows. In FIG. 1, an alternating current of a MHz band is applied to the first and second MI elements 11 and 12 through leads (not shown in the drawing). A voltage by the impedance inherent in the element is generated between two ends 11a or 12a of each of the first and second MI elements 11 and 12. When a magnetic flux by an external magnetic field having a given vector is applied to the first MI element 11, the impedance between two ends 11a of the first MI element 11 corresponds to a component of the magnetic flux parallel to the longitudinal direction of the first MI element 11 (an X-axis component). Similarly, when the magnetic flux is applied to the second MI element 12, the impedance between two ends 12a of the second MI element 12 corresponds to a component of the magnetic flux parallel to the longitudinal direction of the second MI element 12 (a Y-axis component). When the vector of the magnetic flux by the external magnetic field changes with respect to the first and second MI elements 11 and 12, the impedances of the first and second MI elements 11 and 12 change, resulting in changes in the output voltages from the first and second MI elements 11 and 12.

Accordingly, the azimuth sensor 10 generates an output current corresponding to the output voltage in response to the X-axis component of the geomagnetic field through the output terminals 16a and 17a and an output current corresponding to the output voltage in response to the Y-axis component of the geomagnetic field through the output terminals 16a and 17a. These output currents are fed into a processing section (not shown in the drawing) through the external output leads 16b, 17b and 18b. The processing section determines the direction of the magnetic flux by the geomagnetism based on the output currents.

The MI element in accordance with the present invention can detect a magnetism of approximately $10^{-5}$ Oe, whereas conventional MR elements have a sensitivity of approximately 0.1 Oe. When an alternating current of several MHz to several tens of MHz is applied to the first and second MI elements 11 and 12 that are connected to a self-oscillator such as a Colpitts oscillator, the sensor can detect a very weak external magnetic field with a resolution of approximately $10^{-6}$ Oe. Since the sensitivity for the magnetic detection is satisfactorily high even when the impedance of the first and second MI elements 11 and 12 are reduced by their length reduction, the azimuth sensor 10 can be miniaturized.

As described above, the azimuth sensor 10 has coils 14 and 15 for applying a biasing magnetization to the first and second MI elements 11 and 12. These MI elements show a change in the output voltage or impedance with the absolute value of an external magnetic field, and the change is symmetrical with respect to an external magnetic field of zero.

Figure 2A:
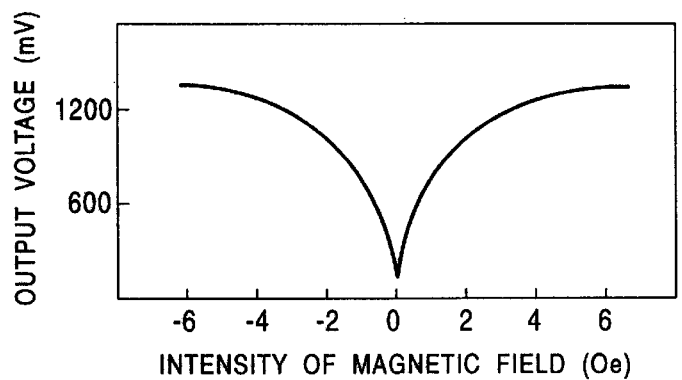
FIGS. 2A to 2C are graphs illustrating the relationship between the external magnetic field and the output voltage in a magneto-impedance element in accordance with the present invention.
Figure 2B:
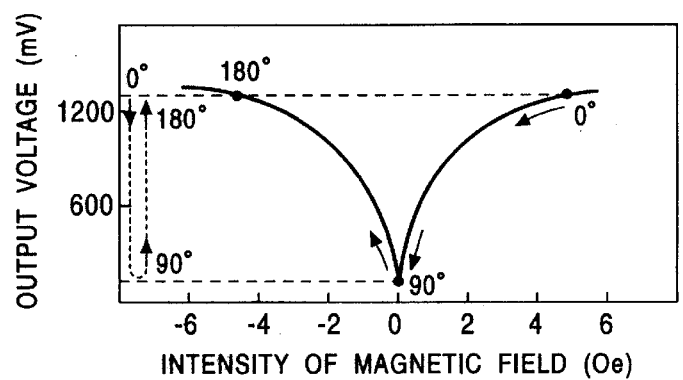

When a biasing magnetization is not applied to the first and second MI elements 11 and 12, as shown in FIG. 2B, the output voltage from the first MI element 11 decreases as the direction of the magnetic flux by the external magnetic field is changed from 0° to 90° to the longitudinal direction of the first MI element 11. The output voltage from the first MI element 12 increases as the direction of the magnetic flux by the external magnetic field is changed from 90° to 180°. Since the output voltages for 0° and 180° are the same, the direction of the magnetic flux cannot be exactly determined.

Figure 2C:
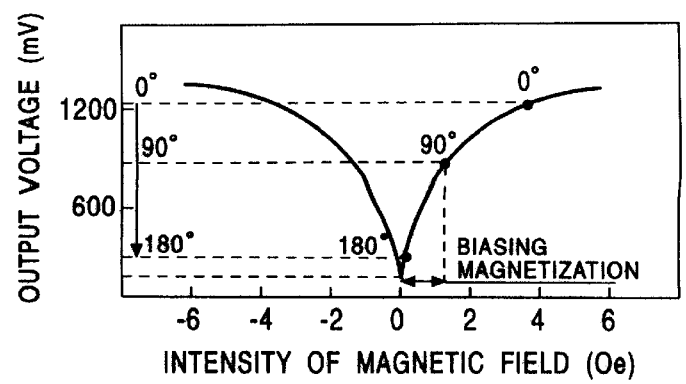

In contrast, when a biasing magnetization is applied to the first and second MI elements 11 and 12, as shown in FIG. 2C, the impedance linearly changes within a range of the direction in the external magnetic field from 0° to 180°. Thus, the direction of the external magnetic field can be exactly determined.

It is preferable that the absolute values of the biasing magnetizations applied to the first and second MI elements 11 and 12 lie in a range of 0.1 to 2 Oe. For a biasing magnetization outside this range, the impedance does not show a linear change with the external magnetic field. As a result, a direct biasing current of several mA is applied to the coils 14 and 15 to generate a desired biasing magnetization.

As described above, the soft magnetic alloy as the constituent of the first and second MI elements 11 and 12 consists essentially of a crystal phase of fine crystal grains with an average crystal grain size of 50 nm or less, and an amorphous phase. The crystal phase has a body centered cubic (bcc) structure. Furthermore, the soft magnetic alloy contains at least one primary metal of selected from the group consisting of Fe, Co, and Ni; at least one element selected from the group consisting of Ti, Zr, Hf, V, Nb, Ta, Cr, Mo, and W; and B. A preferred soft magnetic alloy has a composition represented by any one of the above-described formulae (I) to (IV).

The first and second MI elements 11 and 12 comprising such a soft magnetic alloy have small magnetostriction, high saturation magnetic flux density, high permeability, and a high magneto-impedance effect. Thus, the azimuth sensor 10 has a sufficiently high sensitivity to detect a very weak external magnetic field such as that of geomagnetism.

Since the MI element in accordance with the present invention has high sensitivity to the external magnetic field, the first and second MI elements 11 and 12 and thus the azimuth sensor 10 can be miniaturized.

Since the soft magnetic alloy having the above-mentioned composition has high workability, it can be readily shaped into a ribbon, thin film or a wire as a MI element. As a result, an azimuth sensor can be produced at reduced production cost.

The first and second MI elements 11 and 12 have a moderate change in the output voltage within a very weak external magnetic field of −2 Oe to +2 Oe. Since such a change is linear and quantitative, the azimuth sensor 10 having the above-described configuration can exactly determine the direction of the magnetic flux due to geomagnetism. Further, a circuit having a simplified configuration can process the output voltage, resulting in production cost reduction of the azimuth sensor 10. Since the biasing magnetization is small, that is, at most 2 Oe, a circuit for applying a biasing magnetization has a simple configuration.

Figure 3:
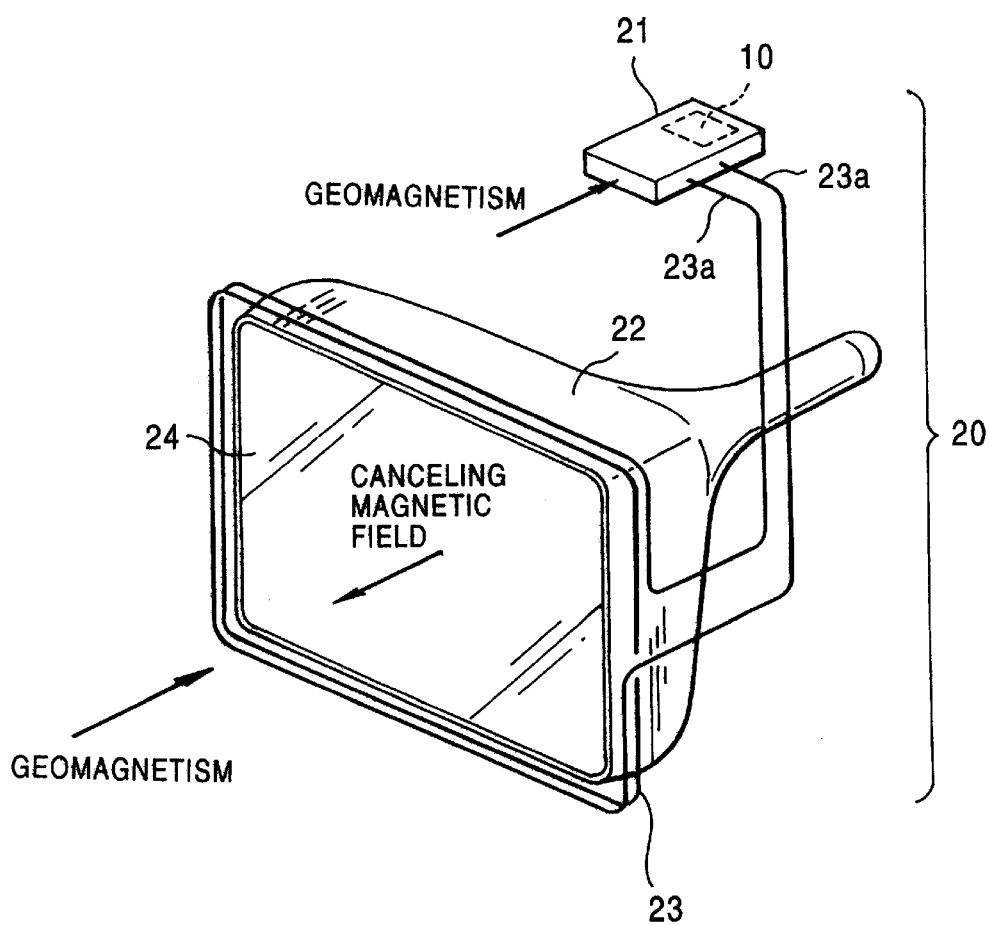
FIG. 3 is an isometric view of an autocanceler in accordance with the present invention.

An autocanceler using the MI element in accordance with the present invention will now be described. With reference to FIGS. 1 and 3, an autocanceler 20 has an azimuth sensor 10 detecting the vector of the magnetic flux from an external magnetic field, a canceling coil 23 wound around a screen 24 of a CRT 22, and a controller 21. The canceling coil 23 applies a canceling magnetic field having the reverse vector to the magnetic flux of an external magnetic field to the CRT 22. The controller 21 controls the magnitude of the canceling magnetic field based on the vector of the magnetic flux by the external magnetic field. Two ends 23a of the canceling coil 23 are connected to the controller 21. The above-mentioned azimuth sensor 10 is also preferably used in the autocanceler 20.

The operation of the autocanceler is as follows. In FIG. 1, an alternating current of a MHz band is applied to the first and second MI elements 11 and 12 though leads (not shown in the drawing). A voltage due to the impedance inherent in the element is generated between two ends 11a and/or 12a of each of the first and/or second MI elements 11 and 12. When a magnetic flux from an external magnetic field having a given vector, such as that of geomagnetism, is applied to the first MI element 11, the impedance between two ends 11a of the first MI element 11 corresponds to a component of the magnetic flux parallel to the longitudinal direction of the first MI element 11 (an X-axis component). Similarly, when the magnetic flux is applied to the second MI element 12, the impedance between two ends 12a of the second MI element 12 corresponds to a component of the magnetic flux parallel to the longitudinal direction of the second MI element 12 (a Y-axis component). When the vector of the magnetic flux by the external magnetic field changes to the first and second MI elements 11 and 12, the impedances, and thus the output voltages of the first and second MI elements 11 and 12 change.

Accordingly, the azimuth sensor 10 generates an output current corresponding to the output voltage in response to the X-axis component of the geomagnetic field through the output terminals 16a and 17a and an output current corresponding to the output voltage in response to the Y-axis component of the geomagnetic field through the output terminals 18a and 17a. These output currents are fed into a processing section (not shown in the drawing) in the control section 21 (shown in FIG. 3) through the external output leads 16b, 17b and 18b. The processing section determines the vector of the magnetic flux by the geomagnetism based on the output currents.

Since the geomagnetic field is nearly uniform over the earth, the control section 21 determines the component of the magnetic flux of the geomagnetism in the vertical direction of the screen 24 of the CRT 22 based on the direction of the magnetic flux which is detected by the azimuth sensor 10. A current corresponding to the component is applied to the canceling coil 23 through the control section 21 so as to generate a canceling magnetic field having the reverse vector to the magnetic flux of the geomagnetism. Thus, the magnetic flux by the geomagnetism is cancelled. Since electron beams in the CRT 22 are prevented from perturbation, distorted images and irregular color distribution caused by the external magnetic field are prevented.

The MI element in accordance with the present invention can detect a magnetic field of approximately $10^{-5}$ Oe, whereas conventional MR elements have a magnetic sensitivity of approximately 0.1 Oe. When an alternating current of several to several tens of MHz is applied to the first and second MI elements 11 and 12 which are connected to a self-oscillator such as a Colpitts oscillator, the sensor can detect a very weak external magnetic field with a resolution of approximately $10^{-6}$ Oe. Since the sensitivity for magnetic detection is satisfactorily high even when the impedance of the first and second MI elements 11 and 12 are reduced by reduction of their overall length, the autocanceler 20 can be miniaturized.

As described above, the azimuth sensor 10 of the autocanceler 20 has coils 14 and 15 for applying a biasing magnetization to the first and second MI elements 11 and 12. These MI elements show a change in the output voltage or impedance with the absolute value and an external magnetic field, and the change is symmetrical with respect to an external magnetic field of zero, as shown in FIG. 2A.

When a biasing magnetization is not applied to the first and second MI elements 11 and 12, as shown in FIG. 2B, the output voltage from the first MI element 11 decreases as the direction of the magnetic flux by the external magnetic field is changed from 0° to 90° to the longitudinal direction of the first MI element 11. The output voltage from the first MI element 11 increases as the direction of the magnetic flux by the external magnetic field is changed from 90° to 180°. Since the output voltages for 0° and 180° are the same, the direction of the magnetic flux cannot be exactly determined.

In contrast, when a biasing magnetization is applied to the first and second MI elements 11 and 12, as shown in FIG. 2C, the impedance changes linearly within a range of the direction in the external magnetic field from 0° to 180°. Thus, the direction of the external magnetic field can be exactly determined.

It is preferable that the absolute values of the biasing magnetizations applied to the first and second MI elements 11 and 12 lie in a range of 0.1 to 2 Oe. For a biasing magnetization outside this range, the impedance does not show a linear change with the external magnetic field. As a result, a direct biasing current of several mA is applied to the coils 14 and 15 to generate a desired biasing magnetization.

As described above, the soft magnetic alloy as the constituent of the first and second MI elements 11 and 12 consists essentially of a crystal phase of fine crystal grains with an average crystal grain size of 50 nm or less, and an amorphous phase. The crystal phase has a body centered cubic (bcc) structure. Furthermore, the soft magnetic alloy contains at least one primary metal of selected from the group consisting of Fe, Co, and Ni; at least one element selected from the group consisting of Ti, Zr, Hf, V, Nb, Ta, Cr, Mo, and W; and B. A preferred soft magnetic alloy has a composition represented by any one of the above-described formulae (I) to (IV).

The first and second MI elements 11 and 12 comprising such a soft magnetic alloy have small magnetostriction, high saturation magnetic flux density, high permeability, and a high magneto-impedance effect. Thus, the azimuth sensor 10 has a sufficiently high sensitivity to detect a very weak external magnetic field such as geomagnetism.

Since the MI element in accordance with the present invention has high sensitivity to the external magnetic field, the first and second MI elements 11 and 12 and thus the autocanceler 20 can be miniaturized.

Since the soft magnetic alloy having the above-mentioned composition has high workability, it can be readily shaped into a ribbon, thin film or a wire as a MI element. As a result, an autocanceler can be produced at reduced production cost.

The first and second MI elements 11 and 12 have a moderate change in the output voltage within a very weak external magnetic field of −2 Oe to +2 Oe. Since such a change is linear and quantitative, the azimuth sensor 10 having the above-described configuration can exactly determine the direction of the magnetic flux by the geomagnetism. Further, a circuit having a simplified configuration can process the output voltage, resulting in production cost reduction of the autocanceler 20. Since the biasing magnetization is small, that is, at most 2 Oe, a circuit for applying a biasing magnetization has a simple configuration.

Figure 4:
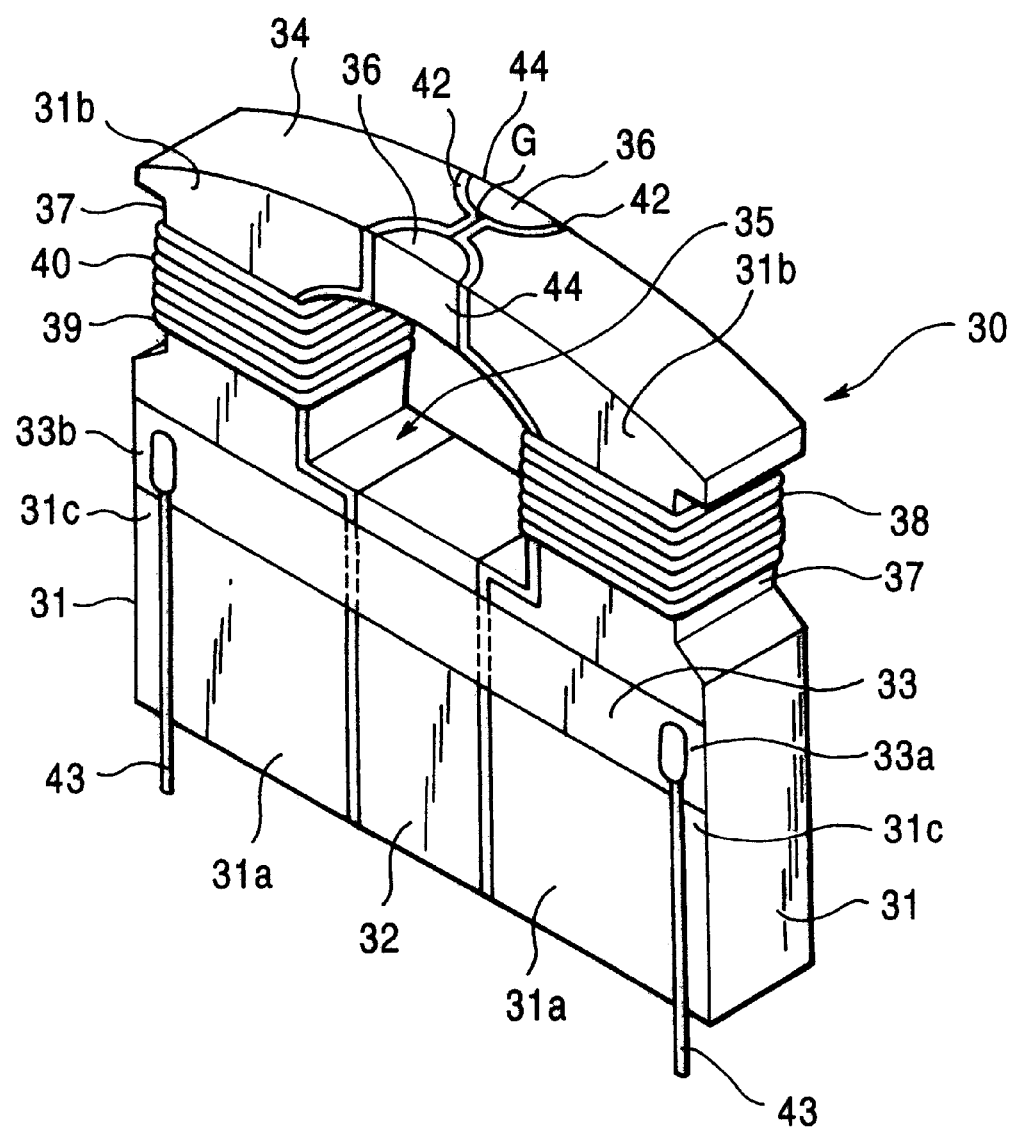
FIG. 4 is an isometric view of a magnetic head in accordance with an embodiment of the present invention.
Figure 5:
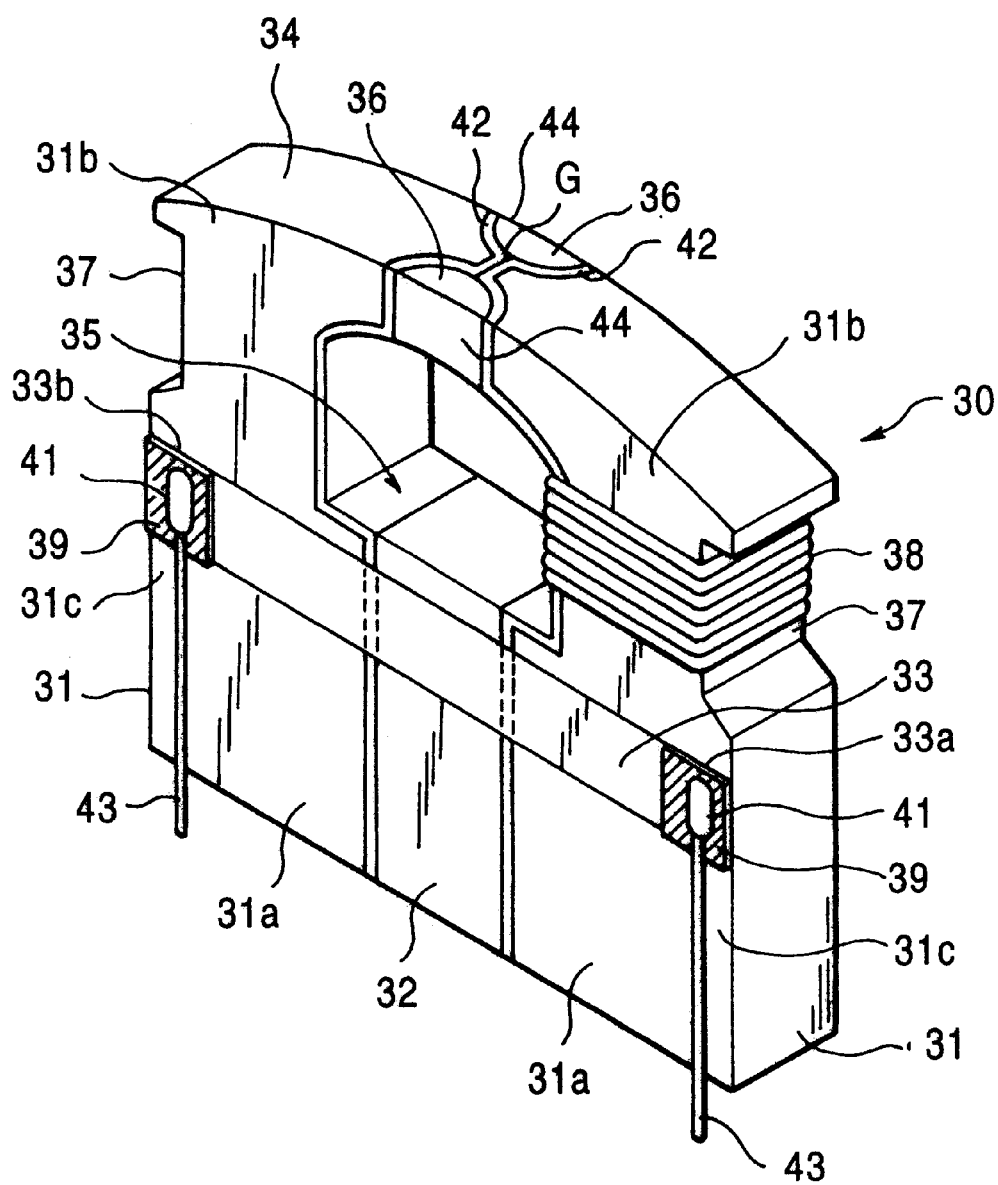
FIG. 5 is an isometric view of a magnetic head in accordance with an embodiment of the present invention.

A magnetic head in accordance with the present invention will now be described with reference to the attached drawings. With reference to FIGS. 4 and 5, a magnetic head 30 has a pair of cores 31 and 31, a bonding glass 32 which is interposed between and bonded to the lower portions 31a and 31a of the paired cores 31 and 31, and a ribbon MI element 33. A sliding face 34 for sliding a recording medium (not shown in the drawing) is formed on the top faces of the cores 31 and 31, and a magnetic gap G is provided in the center of the sliding face 34. The MI element 33 is provided over and bonded to the side faces of the cores 31 and 31. That is, two ends in the longitudinal direction of the MI element 33 are bonded to the magnetic circuit connecting faces 31c and 31c of the cores 31 and 31 by any means. An external magnetic field by the recording magnetization on the recording medium is therefore applied to the MI element 33 through the cores 31 and 31. A closed magnetic circuit is formed between the cores 31 and 31, the MI element 33 and the magnetic gap G.

A ribbon MI element 33 is described as an embodiment in accordance with the present invention. The MI element is, however, not limited to the ribbon. A wire or multistrand wire of a soft magnetic alloy can also be used in the present invention.

The bonding glass 32 composed of a nonmagnetic material separates the paired cores 31 and 31. The cores 31 and 31 have indented sections on the inner sides of the upper portions. The cores 31 and 31 and the bonding glass 32 form a coiling cavity 35 between the two indented sections. The cores 31 and 31 are composed of ferrite, that is, a ferromagnetic oxide. Examples of ferritic materials suitable for cores of magnetic heads include MnZn poly-crystal ferrite, MnZn single-crystal ferrite, and composites thereof. These ferritic materials have high saturation magnetic flux density, high permeability, small eddy current loss due to large electrical resistance, high abrasion resistance due to high hardness, and high sliding characteristics.

A pair of regulating grooves 36 and 36 are provided at the upper junction of the cores 31 and 31. The regulating grooves 36 and 36 regulate the track width of the magnetic gap G and are filled with nonmagnetic glass 44. A coiling groove 37 is formed on the outer face of the upper portion of each core 31 and a recording coil 38 is wound around the coiling groove 37.

The magnetic head 30 has a biasing means 39 that applies a bias magnetization to the MI element 33. In an embodiment of the biasing means 39, as shown in FIG. 4, a biasing current is introduced into the biasing coil 40 wound around the coiling groove 37 so as to apply a magnetic flux to the core 31, and the magnetic flux as a biasing magnetization is applied to the MI element 33 through the core 31.

In another embodiment of the biasing means 39 as shown in FIG. 5, the magnetization of permanent magnet layers 41 provided at two ends 33a and 33b of the MI element 33 is applied to the MI element 33 as a biasing magnetization. The permanent magnetic layer 41 may be composed of any hard magnetic material, and preferably a hard magnetic material such as a Fe—Nd—B or Co—Cr—Pt hard magnetic alloy. The Fe—Nd—B and Co—Cr—Pt hard magnetic alloys have significantly high remanient magnetization and coercive force, hence a permanent magnet 41 with a reduced volume can apply a sufficiently high biasing magnetization to the MI element 33.

The permanent magnetic layers 41 are deposited on the two ends 33a and 33b of the MI element 33 by a film deposition process such as a sputtering process. Leads 43 and 43 for extracting the output signals are connected to the ends 33a and 33b of the MI element 33. Leads for applying an alternating current (not shown in the drawing) are also connected to the MI element 33.

Metallic magnetic films 42 are formed on the cores 31 and 31 of the magnetic head 30 by a film deposition process such as a sputtering process. A gap layer not shown in the drawing is formed on the metallic magnetic films 42 to constitute a metal-in-gap (MIG) type magnetic head. The metallic magnetic film 42 is generally composed of a soft magnetic alloy having a higher permeability than that of ferrite. Examples of preferred soft magnetic alloys include Fe(Ta,Hf)—C alloys, Fe—Si—Al alloys, Fe—Ni alloys and amorphous alloys. The gap layer is composed of a nonmagnetic material such as $SiO_2$, $Al_2O_3$, and $CrSiO_2$.

As described above, the soft magnetic alloy as the constituent of the MI element 33 consists essentially of a crystal phase of fine crystal grains with an average crystal grain size of 50 nm or less, and an amorphous phase. The crystal phase has a body centered cubic (bcc) structure. Furthermore, the soft magnetic alloy contains at least one primary metal selected from the group consisting of Fe, Co, and Ni; at least one element selected from the group consisting of Ti, Zr, Hf, V, Nb, Ta, Cr, Mo, and W; and B. A preferred soft magnetic alloy has a composition represented by any one of the above-described formulae (I) to (IV).

When an alternating current of a MHz band is applied while an external magnetic field is applied to the MI element 33 in the longitudinal direction, the MI element 33 shows magneto-impedance effects, that is, the impedance of the MI element 33 increases with the absolute value of the external magnetic field, and the increase is symmetrical with respect to an external magnetic field of zero.

The magnetic head 30 has a closed magnetic circuit formed between the paired cores 31 and 31, the MI element 33 composed of the soft magnetic glassy alloy, and the magnetic gap G. When a high-frequency alternating current is applied to the MI element 33, the impedance of the MI element 33 sensitively changes depending on a change in the magnetic flux of the external magnetic field that is applied from a recording medium through the cores 3 and 31. Thus, the magnetic head has high sensitivity.

Since the movement of the magnetic wall in the MI element 33 is suppressed by strong overcurrent restriction, a circumferential magnetic flux occurs only by the rotation of the magnetic vector. Thus, the magnetic head 30 can respond to a high-speed magnetic change.

The high-speed responsiveness of the magnetic head is an essential factor for the detection of magnetic information on magnetic recording media. For example, when a 2,000-pole ring magnet with a diameter of 19 mm rotates at 3,600 rpm, a MHz-band cutoff frequency is required for detecting a fundamental wave of 120 kHz and the harmonic waves thereof. The cutoff frequency in current videotape recorders is 4.75 MHz, but will be 50 MHz in the future. The magnetic head 30 having the MI element 33 in accordance with the present invention can respond to the future demand by applying an alternating current of 500 MHz or more.

The magnetic head 30 having the MI element 33 can be combined with aL self-oscillator such as a Colpitts oscillator to form an amplitude-modulation-type magnetic head. Such a magnetic head can detect a wide range of magnetic fields over a direct current to a high frequency of several MHz with a high sensitivity of approximately $10^{-6}$ Oe. Thus, the magnetic head can detect recorded magnetization on recording media having high-density recorded information.

A MI element generally shows a symmetrical change in impedance with respect to an external magnetic field of zero, hence the magnetic head requires direct current magnetic biasing. Since the MI element 33 in accordance with the present invention has a high linearity at a very weak magnetic field, it can respond with a very weak biasing magnetic field. Thus, a biasing current of several mA is introduced into the biasing coil 40 of the biasing means 39, and such a weak biasing current enables a simplified circuit configuration.

Alternatively, permanent magnets 41 and 41 with a small magnetization can be provided at two ends 33a and 33b of the MI element 33. Since the permanent magnets 41 and 41 have a reduced volume, the magnetic head 30 can be miniaturized.

Since the cores 31 and 31 are composed of ferrite, they can apply the recorded magnetization on a recording medium to the MI element 33 without loss. The magnetic head 30, therefore, has high sensitivity. Since ferrite has excellent workability and formability, cores having complicated shapes can be readily produced.

The magnetic head 30 having the recording coil 38 can write recording magnetization on magnetic recording media. Accordingly, the magnetic head 30 having the MI element 33 can be used as a reading/writing head.

The MI element 33 is composed of a soft magnetic glassy alloy that is subjected to heat treatment at 480° C. to 810° C. The MI element 33 has excellent soft magnetism and improved magneto-impedance effects. Accordingly, the magnetic head 30 has high sensitivity.

A MI element wire can be produced using the glassy alloy composition in accordance with the present invention by, for example, a liquid cooling process or a quenching process using a single roll as described in Japanese Patent Laid-Open No. 4-323351. In the liquid cooling process, the alloy composition is melted and continuously sprayed into a cooling liquid to solidify the melt into a wire. The liquid cooling processes are classified into a jetting process that jets the cooling liquid, a centrifugal process, and a melt spinning process that will be described below.

Figure 6:
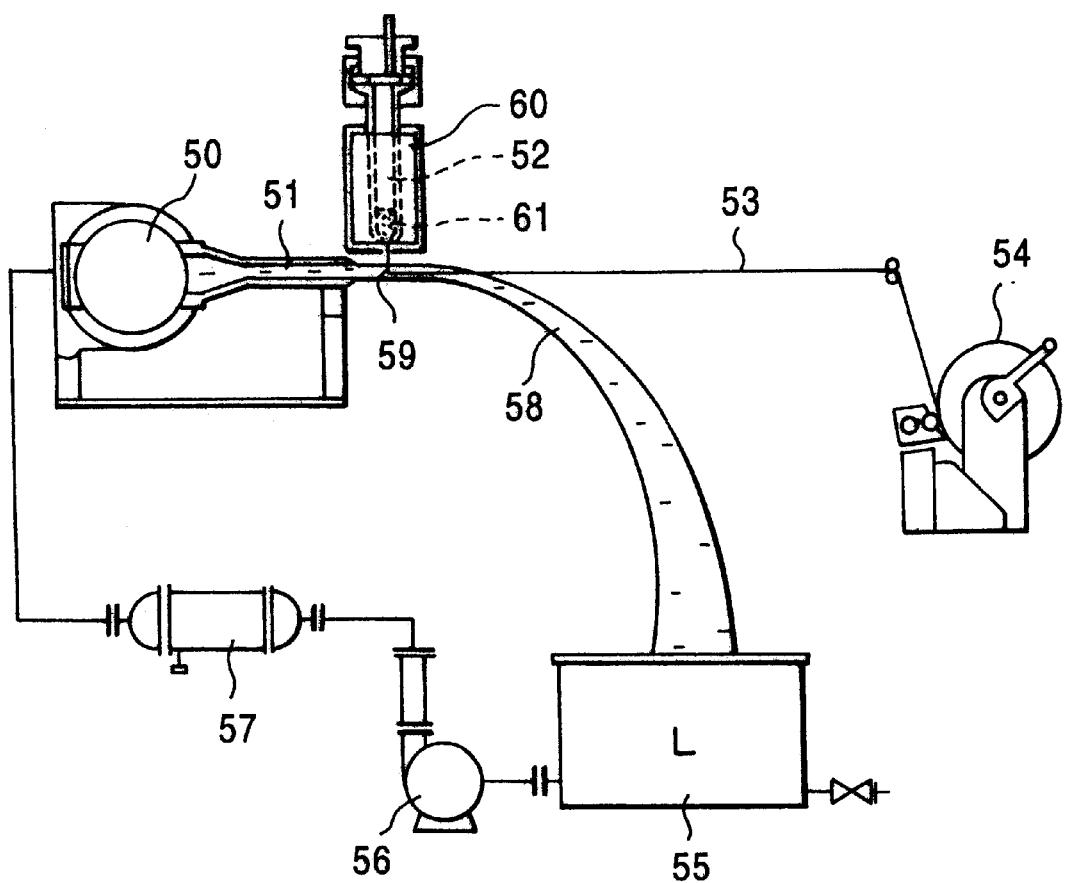
FIG. 6 is a schematic view illustrating a method for making a MI element in accordance with the present invention.

In the jetting process, as shown in FIG. 6, a cooling liquid L in a liquid reservoir 55 is pressurized by a pressurizing pump 56, cooled to a predetermined temperature by a cooler 57, and repressurized to a predetermined pressure by a pressurizing pump 50. The pressurized liquid L is jetted through a jetting nozzle 51 at a given rate to form a jet stream 58 towards the liquid reservoir 55. The alloy composition 61 is melted in a heating oven 60, fed into a melt-jetting unit 52, and jetted from the melt-jetting unit 52 by means of a gaseous argon pressure. The jetted alloy stream 59 is rapidly cooled by the jet stream 58 of the cooling liquid from the jetting nozzle 5 to form a MI element wire 53. The resulting MI element wire 53 is wound on a winding machine 54.

Figure 7:
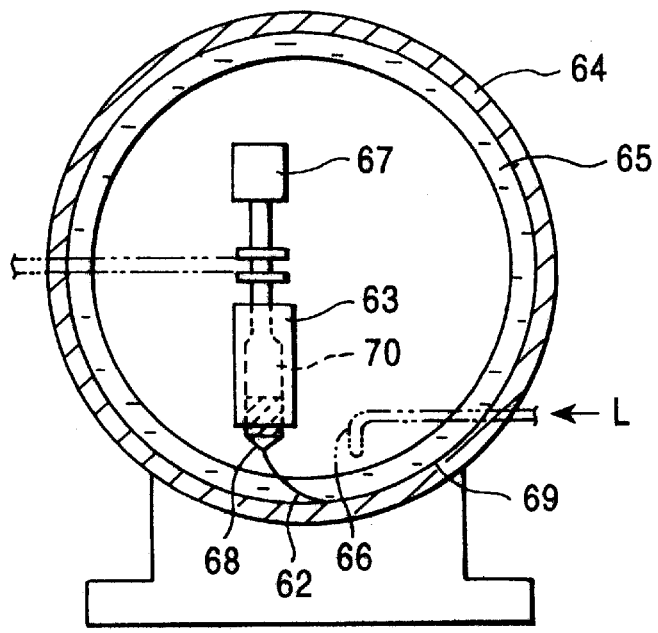
FIG. 7 is a schematic view illustrating another method for making a MI element in accordance with the present invention.

In the centrifugal process, as shown in FIG. 7, the alloy composition is fed into a crucible 70 from a feeding port 67 by gaseous argon, and melted in a heating oven while rotating a drum 64 at a given rotation rate by a driving motor (not shown in the drawing). A cooling liquid L is supplied onto an inner face of the drum 64 from a cooling solution feeding pipe 66 to form a cooling liquid layer 65 by means of a centrifugal force. A nozzle 68 of the crucible 70 is lowered so as to approach the surface of the cooling liquid layer 65 and pressurized so that the melt 62 is jetted onto the surface of the cooling liquid layer 65, while feeding an inert gas into the crucible 70 in order to prevent the melted alloy from oxidizing.

The alloy jetted onto the surface of the cooling liquid layer 65 is solidified to form a MI element wire 69, and is wound along the inner wall of the drum 64 by a combined force of the jetting force, the rotation of the drum and the centrifugal force. After completion of the spinning, the tip of the cooling solution feeding pipe 66 is lowered into the cooling liquid layer 65 to remove the cooling liquid by suction. The drum 64 is stopped to remove the MI element wire 69 from the drum 64.

Figure 8:
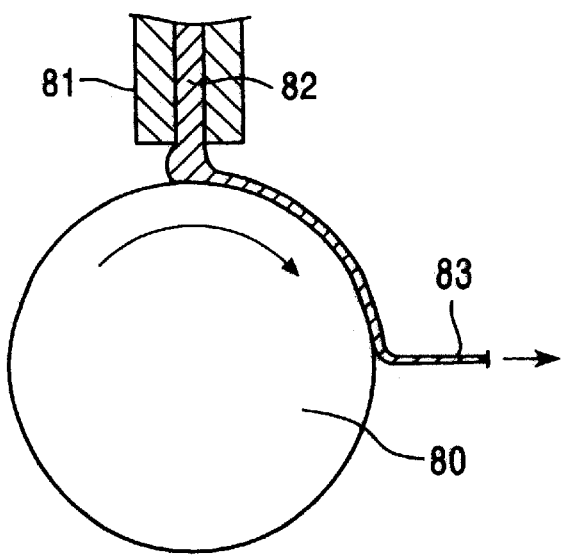
FIG. 8 is a schematic view illustrating another method for making a MI element in accordance with the present invention.

With reference to FIG. 8, in the quenching process using a single roll, a melt alloy 82 is sprayed by means of a pressure of an inert gas such as argon onto a rotating roll 80 composed of steel or copper from a nozzle 81 placed on the rotating roll 80 to form a quenched ribbon 83. The resulting ribbon 83 may be cut into a desired width depending on the specifications of the MI element.

EXAMPLES

The present invention will be more clearly understood with reference to the following examples:
Production of MI Elements Raw materials were weighed and mixed to prepare alloys having the compositions shown in Table 1. Each mixture was melting in an arc melting furnace in a reduced pressure of argon atmshpere to produce an alloy ingot. The alloy ingot was melted in a crucible by radiofrequency induction heating, and then sprayed onto a rotating copper cooling roll (single roll) in a reduced pressure of argon atmosphere to quench the melt. A ribbon was prepared. The ribbon was cut into a piece with a length of 31 mm to prepare a MI element.

TABLE 1

| Example | Composition | Bs (T) | μ' (1 kHz) | Magnetostriction λs (×10⁻⁶) | Ribbon width (mm) | Heating rate (° C./min) | Temp. (° C.) | Holding time (min) |
|---|---|---|---|---|---|---|---|---|
| 1 | $Fe_{84}Zr_{3.5}Nb_{3.5}B_8Cu_1$ | 1.53 | 100,000 | 0.3 | 1.0 | 40 | 680 | 0 |
| 2 | $Fe_{84}Zr_{3.5}Nb_{3.5}B_8Cu_1$ | 1.53 | 100,000 | 0.3 | 0.3 | 40 | 680 | 0 |
| 3 | $Fe_{85.6}Zr_{3.3}Nb_{3.3}B_{6.6}Cu_1$ | 1.57 | 150,000 | −0.3 | 1.0 | 40 | 680 | 0 |
| 4 | $Fe_{85.6}Zr_{3.3}Nb_{3.3}B_{6.6}Cu_1$ | 1.57 | 150,000 | −0.3 | 0.3 | 40 | 680 | 0 |
| 5 | $Fe_{84}Nb_7B_9$ | 1.52 | 40,000 | 0.3 | 1.0 | 180 | 650 | 5 |
| 6 | $Fe_{84}Nb_7B_9$ | 1.52 | 40,000 | 0.3 | 0.3 | 180 | 650 | 5 |
| 7 | $Fe_{84}Nb_7B_9$ | 1.52 | 40,000 | 0.0 | 1.0 | 180 | 750 | 1 |
| 8 | $Fe_{84}Nb_7B_9$ | 1.52 | 40,000 | 0.0 | 0.3 | 180 | 750 | 1 |
| 9 | $Fe_{90}Nb_7B_3$ | 1.70 | 30,000 | −1.0 | 1.0 | 180 | 600 | 5 |
| 10 | $Fe_{90}Nb_7B_3$ | 1.70 | 30,000 | −1.0 | 0.3 | 180 | 600 | 5 |
| 11 | $(Fe_{0.985}Co_{0.015})_{90}Nb_7B_3$ | 1.70 | 30,000 | 0.0 | 1.0 | 180 | 650 | 5 |
| 12 | $(Fe_{0.985}Co_{0.015})_{90}Nb_7B_3$ | 1.70 | 30,000 | 0.0 | 0.3 | 180 | 650 | 5 |
| 13 | $Fe_{73.5}Si_{13.5}B_9Nb_3Cu_1$ | 1.20 | 100,000 | 2.0 | 1.0 | 40 | 550 | 60 |
| 14 | $Fe_{73.5}Si_{13.5}B_9Nb_3Cu_1$ | 1.20 | 100,000 | 2.0 | 0.3 | 40 | 550 | 60 |

Measurement of MI effects

Each MI element was mounted into a magnetic sensing circuit shown in FIG. 9. An alternating current of 400 kHz was applied while an external magnetic field Hex was applied in the longitudinal direction of the MI element. An output voltage (mV) was measured while the external magnetic field Hex was continuously and reciprocally changed from 0 Oe to 5 Oe, 0 Oe, −5 Oe, and then 0 Oe. The amplification factor was 10 times. FIGS. 10 to 16 are graphs of the relationships between the external magnetic field Hex (Oe) and the output voltage (mV) for Examples 1 TO 14.

The graphs show that all of the MI elements in accordance with the present invention have superior characteristics, that is, high sensitivity and quantitative characteristics and low hysteresis in a very weak magnetic field region in a range of −2 Oe to +2 Oe.

Ribbons having a width of 0.3 mm show higher responsiveness than that of ribbons having a width of 1 mm, because the shape of the ribbon with a width of 0.3 mm is substantially a wire. The MI elements not containing Si, that is FeZrNbBCu-, FeNbB-, FeZrB-, and FeCoZrB-based elements have high saturation magnetic flux density of 1.5 to 1.70 T, a high permeability of 30,000 to 100,000, and low magnetostriction.

The Si-containing (FeSiBNbCu-based) MI elements also have a high permeability of 100,000, although they show a slightly low saturation magnetic flux density. The Si-free MI elements show superior soft magnetism even at a short holding time during annealing, whereas the Si-containing MI elements require a holding time of 60 minutes.

As described above, the soft magnetic alloys in accordance with the present invention have superior soft magnetism, that is, high saturation magnetic flux density and high permeability. An azimuth sensor using the soft magnetic alloy as a MI element can exactly detect a very weak geomagnetism. The azimuth sensor sensing an external magnetic field can output a large voltage, that is, this has high sensitivity; hence the circuit for sensing the external magnetic field and processing the output voltage can be simplified.

Since the biasing magnetization is small, that is, at most 2 Oe, a circuit for applying a biasing magnetization has a simple configuration.

With reference to FIG. 18, the MI element in Example 5 has a higher output voltage and thus higher sensitivity to the external magnetic field than that of a conventional $Fe_{78}Si_{19}B_{13}$ MI element. In addition, this MI element shows a moderate increase in the output voltage compared with a conventional $(Fe_{0.06}Co_{0.94})_{72.5}Si_{12.5}B_{15}$ MI element, and thus shows superior quantitative characteristics, permitting a simplified circuit configuration of an azimuth sensor using the MI element.

An autocanceler using the azimuth sensor optimizes the vector of the canceling magnetic field that is generated by a canceling coil, since the azimuth sensor can detect a very weak geomagnetism. The autocanceler using the azimuth sensor sensing an external magnetic field can output a large voltage, that is, this has high sensitivity; hence the circuit for sensing the external magnetic field and processing the output voltage can be simplified. Since the biasing magnetization is small, that is, at most 2 Oe, a circuit for applying a biasing magnetization has a simple configuration.

A magnetic head using the MI element and particularly a twisted wire MI element can detect a very weak magnetic field with high sensitivity, even when the amplification factor of output signals is low. Thus, the output signals have high quality and high quantitative characteristics in a very weak magnetic field region. Thus, biasing magnetization applied to the MI element can be reduced.

With reference to FIG. 18, the MI element in Example 5 has a higher output voltage than that of a conventional $Fe_{78}Si_{19}B_{13}$ MI element, as described above. In addition, this MI element shows a moderate increase in the output voltage compared with a conventional $(Fe_{0.06}Co_{0.94})_{72.5}Si_{12.5}B_{15}$ MI element, and thus shows superior quantitative characteristics in a very weak magnetic field region, permitting a simplified circuit configuration of a magnetic head using the MI element.

While the invention has been particularly shown and described with reference to preferred embodiments thereof, it will be understood by those skilled in the art the foregoing and other changes in form and details can be made therein without departing from the spirit and scope of the invention. For example, the MIG-type magnetic head described in the embodiments may be replaced with a magnetic head in which a metal magnetic film is inserted into a magnetic gap.

What is claimed is:

1. A magneto-impedance element comprising an alloy having a mixed texture of an amorphous phase and a fine crystalline phase having an average crystal grain size of 50 nm or less, said magneto-impedance element showing a change in impedance in response to an external magnetic field by applying an alternating current, wherein said alloy has a composition represented by the following formula:

$$(Fe_{1-a-b}Co_aNi_b)_cB_xM_y$$

wherein M is at least one element selected from the group consisting of Ti, Zr, Hf, V, Nb, Ta, Cr, Mo and W; and the subscripts a, b, c, x and y satisfy the relationships: $0 \leq a+b \leq 0.1$, 75 atomic percent $\leq c \leq 93$ atomic percent, 0.5 atomic percent $\leq x \leq 18$ atomic percent, and 4 atomic percent $\leq y \leq 9$ atomic percent.

2. A magneto-impedance element according to claim 1, wherein said alloy further comprises at least one element selected from the group consisting of Ru, Rh, and Ir in an amount of 5 atomic percent or more in total.

3. A magneto-impedance element comprising an alloy having a mixed texture of an amorphous phase and a fine crystalline phase having an average crystal grain size of 50 nm or less, said magneto-impedance element showing a change in impedance in response to an external magnetic field by applying an alternating current, wherein said alloy has a composition represented by the following formula:

$$(Fe_{1-a-b}Co_aNi_b)_cB_xM_yX_z$$

wherein M is at least one element selected from the group consisting of Ti, Zr, Hf, V, Nb, Ta, Cr, Mo and W; X is at least one element selected from the group consisting of Si, Al, Ge, and Ga; and the subscripts a, b, c, x, y and z satisfy the relationships: $0 \leq a+b \leq 0.1$, 75 atomic percent $\leq c \leq 93$ atomic percent, 0.5 atomic percent $\leq y \leq 9$ atomic percent, and $z \leq 4$ atomic percent.

4. A magneto-impedance element comprising an alloy having a mixed texture of an amorphous phase and a fine crystalline phase having an average crystal grain size of 50 nm or less, said magneto-impedance element showing a change in impedance in response to an external magnetic field by applying an alternating current, wherein said alloy has a composition represented by the following formula:

$$(Fe_{1-a-b}Co_aNi_b)_cB_xM_yT_d$$

wherein M is at least one element selected from the group consisting of Ti, Zr, Hf, V, Nb, Ta, Cr, Mo and W; T is at least one element selected from the group consisting of Cu, Ag, Au, Pd, and Pt; and the subscripts a, b, c, x, y and d satisfy the relationships: $0 \leq a+b \leq 0.1$, 75 atomic percent $\leq c \leq 93$ atomic percent, 0.5 atomic percent $\leq y \leq 9$ atomic percent, and $d \leq 4.5$ atomic percent.

5. A magneto-impedance element according to claim 4, wherein said alloy further comprises at least one element selected from the group consisting of Ru, Rh, and Ir in an amount of 5 atomic percent or more in total.

6. A magneto-impedance element comprising an alloy having a mixed texture of an amorphous phase and a fine crystalline phase having an average crystal grain size of 50 nm or less, said magneto-impedance element showing a change in impedance in response to an external magnetic field by applying an alternating current, wherein said alloy has a composition represented by the following formula:

$$(Fe_{1-a-b}Co_aNi_b)_cB_xM_yT_dX_z$$

wherein M is at least one element selected from the group consisting of Ti, Zr, Hf, V, Nb, Ta, Cr, Mo and W; T is at least one element selected from the group consisting of Cu, Ag, Au, Pd, and Pt; X is at least one element selected from the group consisting of Si, Al, Ge, and Ga; and the subscripts a, b, c, x, y, z and d satisfy the relationships: $0 \leq a+b \leq 0.1$, 75 atomic percent $\leq c \leq 93$ atomic percent, 0.5 atomic percent $\leq x \leq 18$ atomic percent, 4 atomic percent $\leq y \leq 9$ atomic percent, $d \leq 4.5$ atomic percent, and $z \leq 4$ atomic percent.

7. A magneto-impedance element according to claim 6, wherein said alloy further comprises at least one element selected from the group consisting of Ru, Rh, and Ir in an amount of 5 atomic percent or more in total.

8. An azimuth sensor for detecting the direction of the magnetic flux from an external magnetic field and comprising a magneto-impedance element comprising a soft magnetic alloy having a mixed texture of an amorphous phase and a fine crystalline phase having an average crystal grain size of 50 nm or less, said magneto-impedance element showing a change in impedance in response to an external magnetic field by applying an alternating current, wherein said soft magnetic alloy has a composition represented by the following formula:

$$(Fe_{1-a-b}Co_aNi_b)_cB_xM_y$$

wherein M is at least one element selected from the group consisting of Ti, Zr, Hf, V, Nb, Ta, Cr, Mo, and W; and the subscripts a, b, c, x and y satisfy the relationships: $0 \leq a+b \leq 0.1$, 75 atomic percent $\leq c \leq 93$ atomic percent, 0.5 atomic percent $\leq x \leq 18$ atomic percent, and 4 atomic percent $\leq y \leq 9$ atomic percent.

9. An azimuth sensor for detecting the direction of the magnetic flux from an external magnetic field and comprising a magneto-impedance element comprising a soft magnetic alloy having a mixed texture of an amorphous phase and a fine crystalline phase having an average crystal grain size of 50 nm or less, said magneto-impedance element showing a change in impedance in response to an external magnetic field by applying an alternating current, wherein said soft magnetic alloy has a composition represented by the following formula:

$$(Fe_{1-a-b}Co_aNi_b)_cB_xM_yX_z$$

wherein M is at least one element selected from the group consisting of Ti, Zr, Hf, V, Nb, Ta, Cr, Mo, and W; X is at least one element selected from the group consisting of Si, Al, Ge, and Ga; and the subscripts a, b, c, x, y and z satisfy the relationships: $0 \leq a+b \leq 0.1$, 75 atomic percent $\leq c \leq 93$ atomic percent, 0.5 atomic percent $\leq x \leq 18$ atomic percent, 4 atomic percent $\leq y \leq 9$ atomic percent, and $z \leq 4$ atomic percent.

10. An azimuth sensor for detecting the direction of the magnetic flux from an external magnetic field and comprising a magneto-impedance element comprising a soft magnetic alloy having a mixed texture of an amorphous phase and a fine crystalline phase having an average crystal grain size of 50 nm or less, said magneto-impedance element showing a change in impedance in response to an external magnetic field by applying an alternating current, wherein said soft magnetic alloy has a composition represented by the following formula:

$$(Fe_{1-a-b}Co_aNi_b)_cB_xM_yT_d$$

wherein M is at least one element selected from the group consisting of Ti, Zr, Hf, V, Nb, Ta, Cr, Mo, and W; T is at least one element selected from the group consisting of Cu, Ag, Au, Pd, and Pt; and the subscripts a, b, c, x, y and d satisfy the relationships: $0 \leq a+b \leq 0.1$, 75 atomic percent $\leq c \leq 93$ atomic percent, 0.5 atomic percent $\leq x \leq 18$ atomic percent, 4 atomic percent $\leq y \leq 9$ atomic percent, and $d \leq 4.5$ atomic percent.

11. An azimuth sensor for detecting the direction of the magnetic flux from an external magnetic field and comprising a magneto-impedance element comprising a soft magnetic alloy having a mixed texture of an amorphous phase and a fine crystalline phase having an average crystal grain size of 50 nm or less, said magneto-impedance element showing a change in impedance in response to an external magnetic field by applying an alternating current, wherein said soft magnetic alloy has a composition represented by the following formula:

$$(Fe_{1-a-b}Co_aNi_b)_cB_xM_yT_dX_z$$

wherein M is at least one element selected from the group consisting of Ti, Zr, Hf, V, Nb, Ta, Cr, Mo, and W; T is at least one element selected from the group consisting of Cu, Ag, Au, Pd, and Pt; and the subscripts a, b, c, x, y, z and d satisfy the relationships: $0 \leq a+b \leq 0.1$, 75 atomic percent $\leq c \leq 93$ atomic percent, 0.5 atomic percent $\leq x \leq 18$ atomic percent, 4 atomic percent $\leq y \leq 9$ atomic percent, and $d \leq 4.5$ atomic percent, and $z \leq 4$ atomic percent.

12. An autocanceler comprising:
a magnetic sensor sensing a vector of the magnetic flux from an external magnetic field;
a canceling coil for applying a canceling magnetic field having the reverse vector to said magnetic flux detected by the magnetic sensor to a CRT tube; and
a control unit for controlling the vector of said canceling magnetic field based on the vector of said magnetic flux of the external magnetic field detected by the magnetic sensor;
wherein said magnetic sensor comprises a magneto-impedance element comprising a soft magnetic alloy having a mixed texture of an amorphous phase and a fine crystalline phase having an average crystal grain size of 50 nm or less, said magneto-impedance element showing a change in impedance in response to an external magnetic field by applying an alternating current,
wherein said soft magnetic alloy has a composition represented by the following formula:

$$(Fe_{1-a-b}Co_aNi_b)_cB_xM_y$$

wherein M is at least one element selected from the group consisting of Ti, Zr, Hf, V, Nb, Ta, Cr, Mo, and W; and the subscripts a, b, c, x and y satisfy the relationships: $0 \leq a+b \leq 0.1$, 75 atomic percent $\leq c \leq 93$ atomic percent, 0.5 atomic percent $\leq x \leq 18$ atomic percent, 4 atomic percent $\leq y \leq 9$ atomic percent.

13. An autocanceler sensor comprising:
a magnetic sensor sensing a vector of the magnetic flux from an external magnetic field;
a canceling coil for applying a canceling magnetic field having the reverse vector to said magnetic flux detected by the magnetic sensor to a CRT tube; and
a control unit for controlling the vector of said canceling magnetic field based on the vector of said magnetic flux of the external magnetic field detected by the magnetic sensor;
wherein said magnetic sensor comprises a magneto-impedance element comprising a soft magnetic alloy having a mixed texture of an amorphous phase and a fine crystalline phase having an average crystal grain size of 50 nm or less, said magneto-impedance element showing a change in impedance in response to an external magnetic field by applying an alternating current,
wherein said soft magnetic alloy has a composition represented by the following formula:

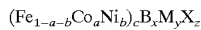

$(Fe_{1-a-b}Co_aNi_b)_cB_xM_yX_z$ wherein M is at least one element selected from the group consisting of Ti, Zr, Hf, V, Nb, Ta, Cr, Mo, and W; X is at least one element selected from the group consisting of Si, Al, Ge, and Ga; and the subscripts a, b, c, x, y and z satisfy the relationships: $0 \leq a+b \leq 0.1$, 75 atomic percent $\leq c \leq 93$ atomic percent, 0.5 atomic percent $\leq x \leq 18$ atomic percent, 4 atomic percent $\leq y \leq 9$ atomic percent, and $d \leq 4$ atomic percent.

14. An autocanceler sensor comprising:
a magnetic sensor sensing a vector of the magnetic flux from an external magnetic field;
a canceling coil for applying a canceling magnetic field having the reverse vector to said magnetic flux detected by the magnetic sensor to a CRT tube; and
a control unit for controlling the vector of said canceling magnetic field based on the vector of said magnetic flux of the external magnetic field detected by the magnetic sensor;
wherein said magnetic sensor comprises a magneto-impedance element comprising a soft magnetic alloy having a mixed texture of an amorphous phase and a fine crystalline phase having an average crystal grain size of 50 nm or less, said magneto-impedance element showing a change in impedance in response to an external magnetic field by applying an alternating current,
wherein said soft magnetic alloy has a composition represented by the following formula:

$(Fe_{1-a-b}Co_aNi_b)_cB_xM_yT_d$ wherein M is at least one element selected from the group consisting of Ti, Zr, Hf, V, Nb, Ta, Cr, Mo, and W; T is at least one element selected from the group consisting of Cu, Ag, Au, Pd, and Pt; and the subscripts a, b, c, x, y and d satisfy the relationships: $0 \leq a+b \leq 0.1$, 75 atomic percent $\leq c \leq 93$ atomic percent, 0.5 atomic percent $\leq x \leq 18$ atomic percent, 4 atomic percent $\leq y \leq 9$ atomic percent, and $d \leq 4.5$ atomic percent.

15. An autocanceler sensor comprising:
a magnetic sensor sensing a vector of the magnetic flux from an external magnetic field;
a canceling coil for applying a canceling magnetic field having the reverse vector to said magnetic flux detected by the magnetic sensor to a CRT tube; and
a control unit for controlling the vector of said canceling magnetic field based on the vector of said magnetic flux of the external magnetic field detected by the magnetic sensor;
wherein said magnetic sensor comprises a magneto-impedance element comprising a soft magnetic alloy having a mixed texture of an amorphous phase and a fine crystalline phase having an average crystal grain size of 50 nm or less, said magneto-impedance element showing a change in impedance in response to an external magnetic field by applying an alternating current,
wherein said soft magnetic alloy has a composition represented by the following formula:

$(Fe_{1-a-b}Co_aNi_b)_cB_xM_yT_dX_z$ wherein M is at least one element selected from the group consisting of Ti, Zr, Hf, V, Nb, Ta, Cr, Mo, and W; T is at least one element selected from the group consisting of Cu, Ag, Au, Pd, and Pt; X is at least one element selected from the group consisting of Si, Al, Ge, and Ga; and the subscripts a, b, c, x, y, z and d satisfy the relationships: $0 \leq a+b \leq 0.1$, 75 atomic percent $\leq c \leq 93$ atomic percent, 0.5 atomic percent $\leq x \leq 18$ atomic percent, 4 atomic percent $\leq y \leq 9$ atomic percent, and $d \leq 4.5$ atomic percent, and $z \leq 4$ atomic percent.

16. A magnetic head comprising a magneto-impedance element, said magneto-impedance element comprising a soft magnetic alloy having a mixed texture of an amorphous phase and a fine crystalline phase having an average crystal grain size of 50 nm or less, said magneto-impedance element showing a change in impedance in response to an external magnetic field by applying an alternating current, wherein said soft magnetic alloy has a composition represented by the following formula:

$(Fe_{1-a-b}Co_aNi_b)_cB_xM_y$ wherein M is at least one element selected from the group consisting of Ti, Zr, Hf, V, Nb, Ta, Cr, Mo, and W; and the subscripts a, b, c, x and y satisfy the relationships: $0 \leq a+b \leq 0.1$, 75 atomic percent $\leq c \leq 93$ atomic percent, 0.5 atomic percent $\leq x \leq 18$ atomic percent, 4 atomic percent $\leq y \leq 9$ atomic percent.

17. A magnetic head comprising a magneto-impedance element, said magneto-impedance element comprising a soft magnetic alloy having a mixed texture of an amorphous phase and a fine crystalline phase having an average crystal grain size of 50 nm or less, said magneto-impedance element showing a change in impedance in response to an external magnetic field by applying an alternating current, wherein said soft magnetic alloy has a composition represented by the following formula:

$(Fe_{1-a-b}Co_aNi_b)_cB_xM_yX_z$ wherein M is at least one element selected from the group consisting of Ti, Zr, Hf, V, Nb, Ta, Cr, Mo, and W; X is at least one element selected from the group consisting of Si, Al, Ge, and Ga; and the subscripts a, b, c, x, y and z satisfy the relationships: $0 \leq a+b \leq 0.1$, 75 atomic percent $\leq c \leq 93$ atomic percent, 0.5 atomic percent $\leq x \leq 18$ atomic percent, 4 atomic percent $\leq y \leq 9$ atomic percent, and $z \leq 4$ atomic percent.

18. A magnetic head comprising a magneto-impedance element, said magneto-impedance element comprising a soft magnetic alloy having a mixed texture of an amorphous phase and a fine crystalline phase having an average crystal grain size of 50 nm or less, said magneto-impedance element showing a change in impedance in response to an external magnetic field by applying an alternating current, wherein said soft magnetic alloy has a composition represented by the following formula:

$$(Fe_{1-a-b}Co_aNi_b)_cB_xM_yT_d$$

wherein M is at least one element selected from the group consisting of Ti, Zr, Hf, V, Nb, Ta, Cr, Mo, and W; T is at least one element selected from the group consisting of Cu, Ag, Au, Pd, and Pt; and the subscripts a, b, c, x, y and d satisfy the relationships: $0 \leq a+b \leq 0.1$, 75 atomic percent $\leq c \leq 93$ atomic percent, 0.5 atomic percent $\leq x \leq 18$ atomic percent, 4 atomic percent $\leq y \leq 9$ atomic percent, and $d \leq 4.5$ atomic percent.

19. A magnetic head comprising a magneto-impedance element, said magneto-impedance element comprising a soft magnetic alloy having a mixed texture of an amorphous phase and a fine crystalline phase having an average crystal grain size of 50 nm or less, said magneto-impedance element showing a change in impedance in response to an external magnetic field by applying an alternating current, wherein said soft magnetic alloy has a composition represented by the following formula:

$$(Fe_{1-a-b}Co_aNi_b)_cB_xM_yT_dX_z$$

wherein M is at least one element selected from the group consisting of Ti, Zr, Hf, V, Nb, Ta, Cr, Mo, and W; T is at least one element selected from the group consisting of Cu, Ag, Au, Pd, and Pt; X is at least one element selected from the group consisting of Si, Al, Ge, and Ga; and the subscripts a, b, c, x, y, z and d satisfy the relationships: $0 \leq a+b \leq 0.1$, 75 atomic percent $\leq c \leq 93$ atomic percent, 0.5 atomic percent $\leq x \leq 18$ atomic percent, 4 atomic percent $\leq y \leq 9$ atomic percent, and $d \leq 4.5$ atomic percent, and $z \leq 4$ atomic percent.

* * * * *